United States Patent
Cheng et al.

(10) Patent No.: US 12,183,674 B2
(45) Date of Patent: Dec. 31, 2024

(54) CHIP STRUCTURE WITH ETCH STOP LAYER

(71) Applicant: Taiwan Semiconductor Manufacturing Company, Ltd., Hsinchu (TW)

(72) Inventors: Ping-En Cheng, Hsinchu (TW); Wei-Li Huang, Pingtung (TW); Kun-Ming Tsai, Kaohsiung (TW); Shih-Hao Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 53 days.

(21) Appl. No.: 18/308,875

(22) Filed: Apr. 28, 2023

(65) Prior Publication Data

US 2023/0268272 A1 Aug. 24, 2023

Related U.S. Application Data

(62) Division of application No. 17/400,764, filed on Aug. 12, 2021, now Pat. No. 11,670,590.

(51) Int. Cl.
*H01L 23/528* (2006.01)
*H01L 21/768* (2006.01)

(52) U.S. Cl.
CPC ...... *H01L 23/528* (2013.01); *H01L 21/76829* (2013.01); *H01L 21/76841* (2013.01)

(58) Field of Classification Search
CPC ............. H01L 23/528; H01L 21/76829; H01L 21/76841; H01L 23/53295; H01L 24/05; H01L 23/522
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2015/0228595 A1* | 8/2015 | Willeke ............ H01L 24/11 438/754 |
| 2021/0098405 A1 | 4/2021 | Chu et al. |

* cited by examiner

*Primary Examiner* — Thanhha S Pham
(74) *Attorney, Agent, or Firm* — McClure, Qualey & Rodack, LLP

(57) ABSTRACT

A chip structure is provided. The chip structure includes a substrate. The chip structure includes an interconnect structure over the substrate. The chip structure includes a conductive pad over the interconnect structure. The chip structure includes a passivation layer covering the interconnect structure and exposing the conductive pad. The chip structure includes a first etch stop layer over the passivation layer. The chip structure includes a first buffer layer over the first etch stop layer. The first etch stop layer and the first buffer layer are made of different materials. The chip structure includes a second etch stop layer over the first buffer layer. The second etch stop layer and the first buffer layer are made of different materials. The chip structure includes a device element over the second etch stop layer.

20 Claims, 16 Drawing Sheets

CHIP STRUCTURE WITH ETCH STOP LAYER

CROSS REFERENCE

This application is a Divisional of U.S. application Ser. No. 17/400,764, filed on Aug. 12, 2021, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a cross-sectional view of a stage of a process for forming a chip structure, in accordance with some embodiments.

FIG. 2A-1 is a cross-sectional view of a stage of a process for forming a chip structure, in accordance with some embodiments.

FIG. 3A-1 is a cross-sectional view of a stage of a process for forming a chip structure, in accordance with some embodiments.

DETAILED DESCRIPTION

Figure 1A:
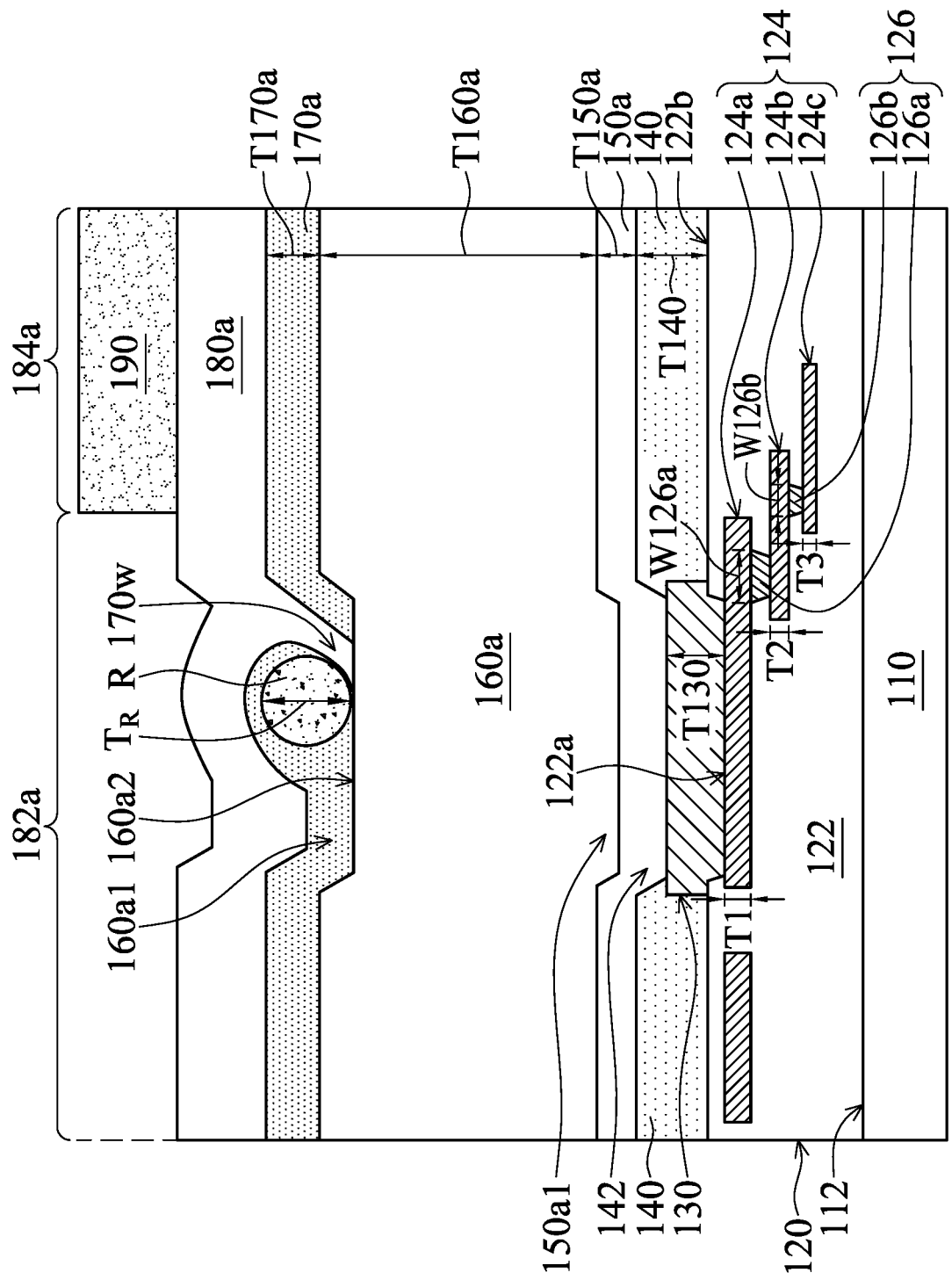
FIGS. 1A-1C are cross-sectional views of various stages of a process for forming a chip structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the chip structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figures 1, 1A:
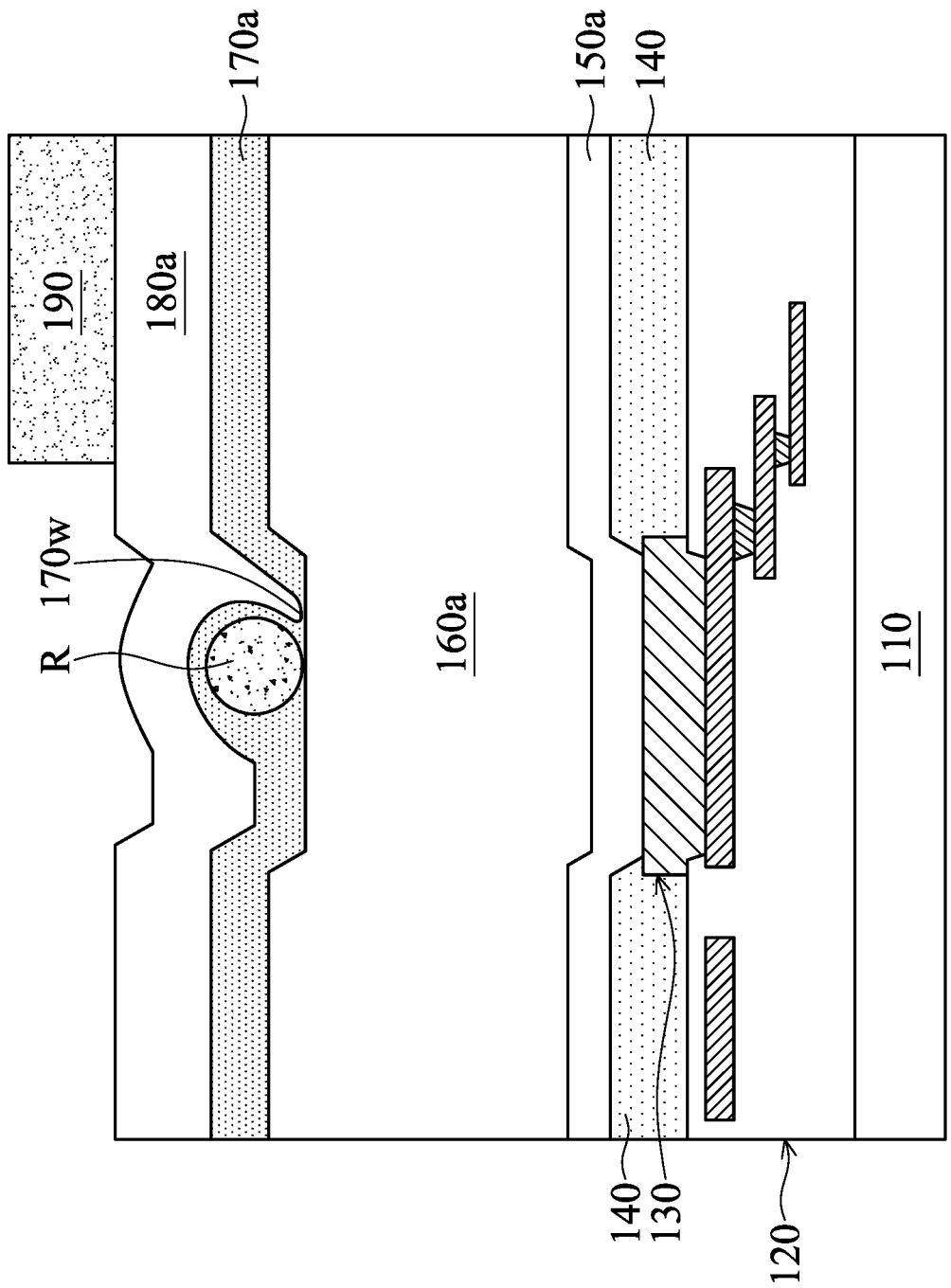
Figure 1B:
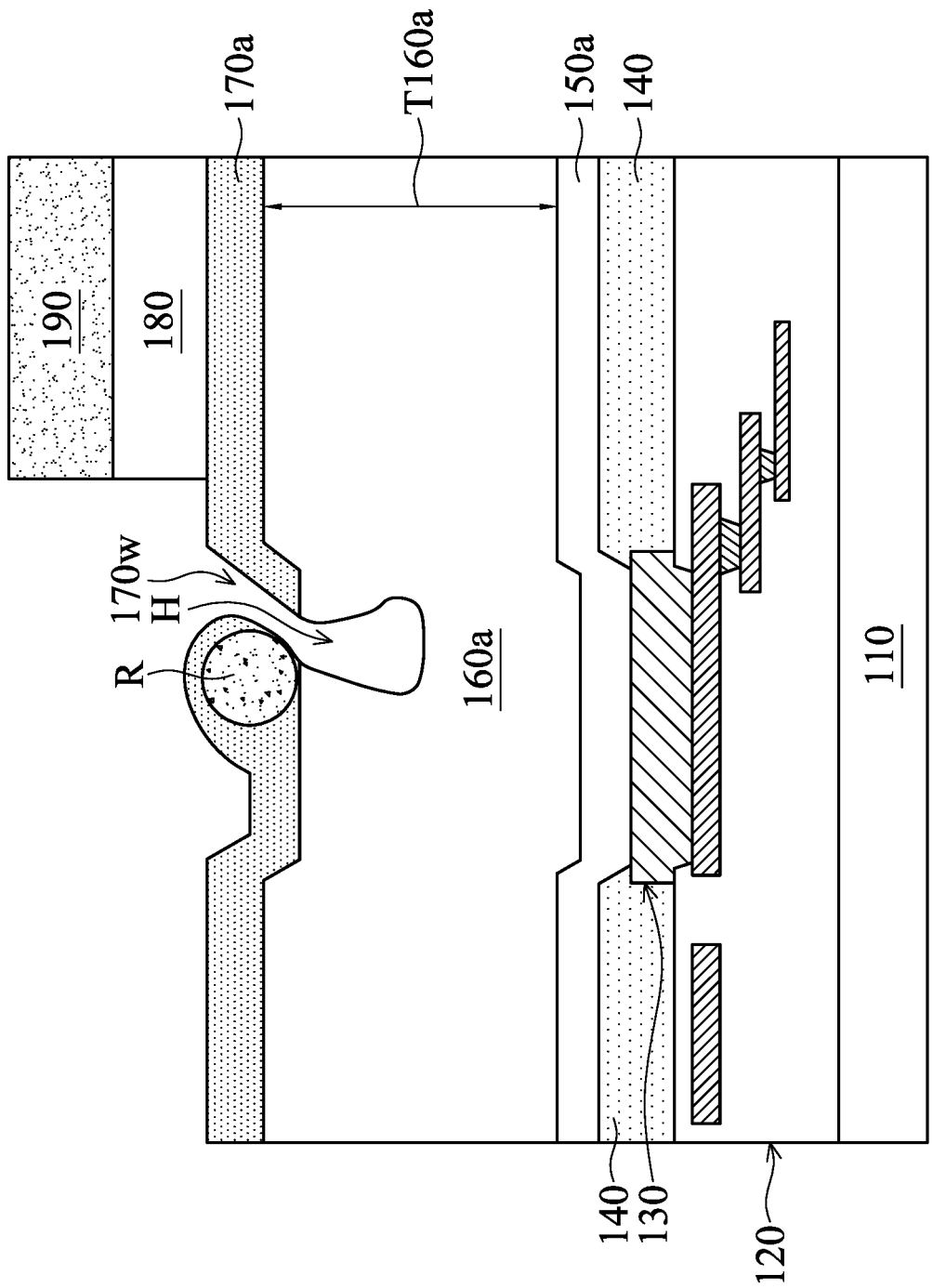
Figure 1C:
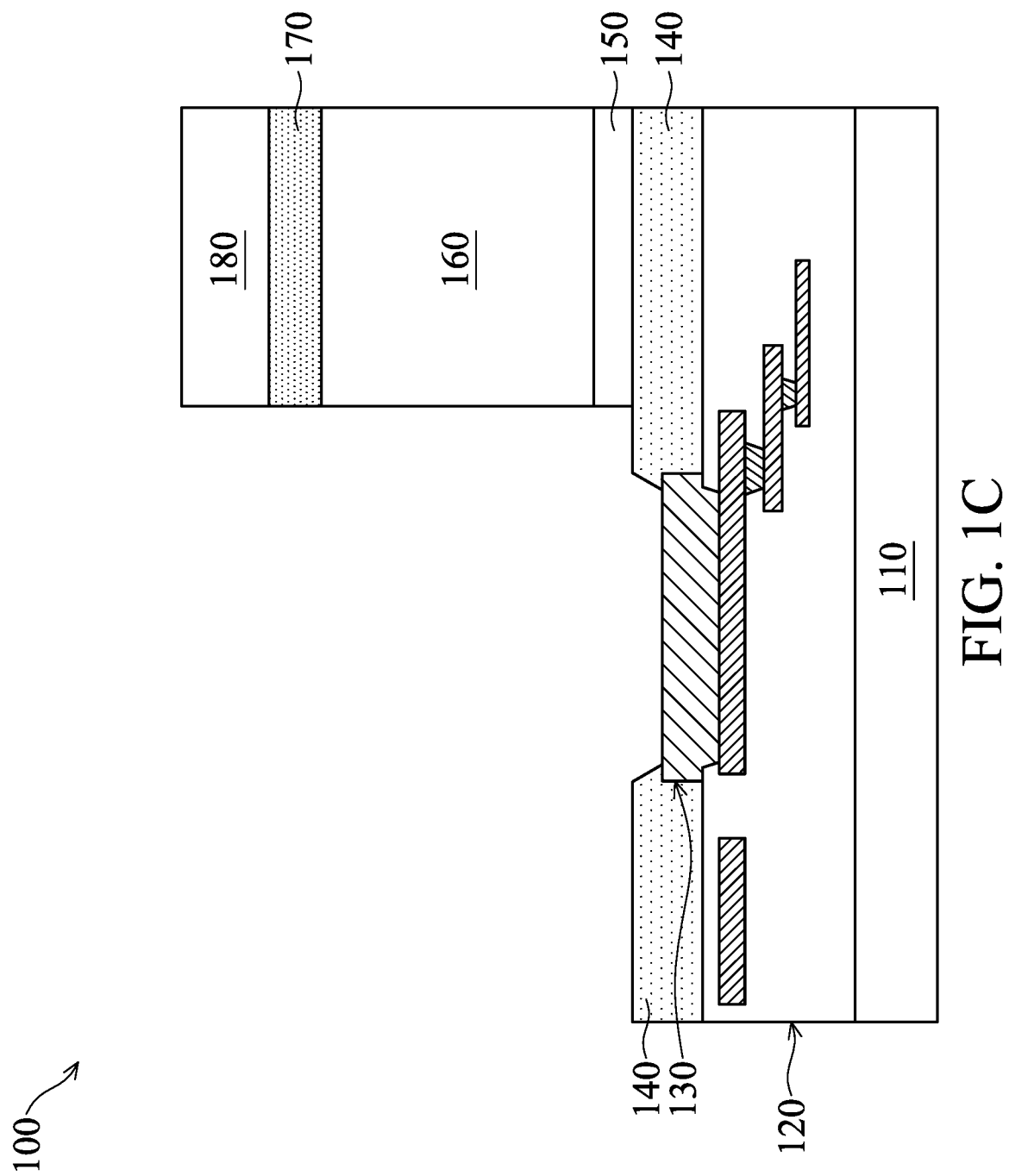

FIGS. 1A-1C are cross-sectional views of various stages of a process for forming a chip structure, in accordance with some embodiments. As shown in FIG. 1A, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an interconnect structure 120 is formed over the substrate 110, in accordance with some embodiments. The interconnect structure 120 includes a dielectric structure 122, wiring layers 124, and conductive vias 126, in accordance with some embodiments. The dielectric structure 122 is formed over a surface 112 of the substrate 110, in accordance with some embodiments.

The wiring layers 124 and the conductive vias 126 are formed in the dielectric structure 122, in accordance with some embodiments. The conductive vias 126 are electrically connected between different wiring layers 124 and between the wiring layer 124 and the aforementioned device elements, in accordance with some embodiments.

For the sake of simplicity, FIG. 1A only shows three wiring layers 124a, 124b, and 124c of the wiring layers 124, in accordance with some embodiments. The dielectric structure 122 has an opening 122a exposing a portion of the wiring layer 124a, in accordance with some embodiments. The wiring layer 124a is a top-most wiring layer of the interconnect structure 120, in accordance with some embodiments.

The thickness T1 of the wiring layer 124a is greater than the thickness T2 of the wiring layer 124b, in accordance with some embodiments. The thickness T2 of the wiring layer 124b is greater than the thickness T3 of the wiring layer 124c, in accordance with some embodiments.

For the sake of simplicity, FIG. 1A only shows two conductive vias 126a and 126b of the conductive vias 126, in accordance with some embodiments. The width W126a of the conductive via 126a is greater than the width W126b of the conductive via 126b, in accordance with some embodiments.

The dielectric structure 122 is made of an oxide-containing material (e.g. silicon oxide or undoped silicate glass) or another suitable insulating material, in accordance with some embodiments. The wiring layers 124 and the conductive vias 126 are made of conductive materials such as metal (e.g., aluminum, copper, gold, silver, tungsten or the like) or alloys thereof, in accordance with some embodiments.

As shown in FIG. 1A, conductive pads 130 are formed over the interconnect structure 120, in accordance with some embodiments. For the sake of simplicity, FIG. 1A only shows one of the conductive pads 130, in accordance with some embodiments. The conductive pad 130 is formed over a top surface 122b of the dielectric structure 122 and the portion of the wiring layer 124a exposed by the opening 122a, in accordance with some embodiments.

The conductive pad 130 is electrically and physically connected to the wiring layer 124a, in accordance with some embodiments. The thickness T130 of the conductive pad 130 is greater than the thickness T1 of the wiring layer 124a, in accordance with some embodiments. The conductive pad 130 is made of a conductive material, such as metal (e.g., aluminum, copper, gold, silver, tungsten, or the like) or alloys thereof, in accordance with some embodiments.

As shown in FIG. 1A, a passivation layer 140 is formed over the interconnect structure 120 and the conductive pad 130, in accordance with some embodiments. The passivation layer 140 is used to protect the interconnect structure 120 thereunder, in accordance with some embodiments. The passivation layer 140 has an opening 142, in accordance with some embodiments. The opening 142 exposes a portion of the conductive pad 130, in accordance with some embodiments.

The thickness T140 ranges from about 3 µm to about 10 µm, in accordance with some embodiments. The passivation layer 140 is made of an insulating material, such as a polymer material (e.g., polyimide, a photosensitive material, or polybenzoxazole), in accordance with some embodiments.

As shown in FIG. 1A, a glue material layer 150a is conformally formed over the passivation layer 140 and the conductive pad 130, in accordance with some embodiments. The glue material layer 150a has a recess 150a1 over the opening 142 of the passivation layer 140, in accordance with some embodiments. The glue material layer 150a is used to improve the adhesion between the passivation layer 140 and a layer subsequently formed thereon, in accordance with some embodiments.

The glue material layer 150a is thinner than the passivation layer 140, in accordance with some embodiments. The thickness T150a of the glue material layer 150a ranges from about 200 Å to about 800 Å, in accordance with some embodiments. The glue material layer 150a is made of a metal, such as titanium, tantalum, or another suitable material with good malleability, in accordance with some embodiments.

The glue material layer 150a is formed using a deposition process, such as a chemical vapor deposition process, a physical vapor deposition process, or a plating process, such as an electroplating process, in accordance with some embodiments.

As shown in FIG. 1A, a buffer material layer 160a is formed over the glue material layer 150a, in accordance with some embodiments. The buffer material layer 160a has a recess 160a1 over the recess 150a1 of the glue material layer 150a, in accordance with some embodiments. The buffer material layer 160a is used as an anti-warpage layer to reduce the warpage of the substrate 110, in accordance with some embodiments.

For example, in a thermal process, the buffer material layer 160a has a convex warpage shape, and the substrate 110 has a concave warpage shape. Therefore, the thermal stress of the buffer material layer 160a and the thermal stress of the substrate 110 cancel each other out, in accordance with some embodiments. As a result, the buffer material layer 160a maintains the planarity of the substrate 110 in an acceptable range, in accordance with some embodiments.

The buffer material layer 160a is used as an etch resist layer to protect the conductive pad 130 in subsequent etching processes, in accordance with some embodiments. The buffer material layer 160a is thicker than the glue material layer 150a, in accordance with some embodiments. The buffer material layer 160a is thinner than the passivation layer 140, in accordance with some embodiments. The thickness T160a of the buffer material layer 160a shown in FIG. 1A may be exaggerated for clarity and the convenience of labeling.

The thickness T160a of the buffer material layer 160a ranges from about 4000 Å to about 9000 Å, in accordance with some embodiments. If the thickness T160a is less than 4000 Å, the buffer material layer 160a has not enough etch resistance to protect the conductive pad 130 in subsequent etching processes, in accordance with some embodiments. If the thickness T160a is greater than 9000 Å, the thickness T160a is too large, which is not conducive to form a small size chip structure and to bond the chip structure to another device or a substrate, in accordance with some embodiments.

The buffer material layer 160a is made of a silicon-containing material, such as silicon nitride or silicon oxide, in accordance with some embodiments. The buffer material layer 160a is formed using a chemical vapor deposition (CVD) process, such as a low-pressure chemical vapor deposition process, a plasma-enhanced chemical vapor deposition process, or a high-density plasma chemical vapor deposition process, an atomic layer deposition process, a spin-on process, a physical vapor deposition process, or another suitable process.

As shown in FIG. 1A, there is an undesired particle R in the recess 160a1 of the buffer material layer 160a, in accordance with some embodiments. The undesired particle R may come from the contamination in a processing chamber. The thickness $T_R$ of the undesired particle R ranges from about 300 Å to about 4000 Å, in accordance with some embodiments. The undesired particle R includes carbon, nitride, or another material, in accordance with some embodiments.

As shown in FIG. 1A, an etch stop material layer 170a is formed over the buffer material layer 160a and the undesired particle R, in accordance with some embodiments. The etch stop material layer 170a conformally covers the buffer material layer 160a and the undesired particle R, in accordance with some embodiments. A ratio of the thickness $T_R$ of the undesired particle R to the thickness T170a of the etch stop material layer 170a ranges from about 0.5 to about 6, in accordance with some embodiments.

Since the height difference (e.g., the thickness $T_R$) between a top of the undesired particle R and a surface 160a2 of the buffer material layer 160a is very large, the etch stop material layer 170a is prone to have a weak portion 170w adjacent to the undesired particle R, in accordance with some embodiments. In some embodiments, as shown in FIG. 1A, the weak portion 170w is a hole, which passes through the etch stop material layer 170a.

FIG. 1A-1 is a cross-sectional view of a stage of a process for forming a chip structure, in accordance with some embodiments. In some other embodiments, as shown in FIG. 1A-1, the weak portion 170w is a thin portion, which is thinner than other portions of the etch stop material layer 170a. That is, the weak portion 170w is the thinnest portion of the etch stop material layer 170a, in accordance with some embodiments.

As shown in FIG. 1A, The etch stop material layer 170a and the buffer material layer 160a are made of different materials, which improves an etching selectivity of the etch stop material layer 170a to the buffer material layer 160a, in accordance with some embodiments. The etch resistance of the material of the etch stop material layer 170a is greater than the etch resistance of the material of the buffer material layer 160a, in accordance with some embodiments. For example, in a subsequent wet etching process, an etch rate ratio of the buffer material layer 160a to the etch stop material layer 170a ranges from about 10 to about 20, in accordance with some embodiments.

The buffer material layer 160a is thicker than the etch stop material layer 170a, which improves the etch resistance of the buffer material layer 160a, in accordance with some embodiments. Therefore, the buffer material layer 160a is able to be used as a backup etch stop material layer, in accordance with some embodiments.

In some embodiments, a ratio of the thickness T160a of the buffer material layer 160a to the thickness T170a of the etch stop material layer 170a is substantially equal to the etch rate ratio of the buffer material layer 160a to the etch stop material layer 170a. In some embodiments, a ratio of the thickness T160a of the buffer material layer 160a to the thickness T170a of the etch stop material layer 170a ranges from about 10 to about 20.

The thickness T170a of the etch stop material layer 170a ranges from about 400 Å to about 900 Å, in accordance with some embodiments. In some embodiments, a sum of the thicknesses T150a, T160a, and T170a of the glue material layer 150a, the buffer material layer 160a, and the etch stop material layer 170a ranges from about 8000 Å to about 13000 Å.

The etch stop material layer 170a is made of a metal-containing material, such as tantalum (Ta) and tantalum oxide (TaO), or a polymer material, such as polyimide, in accordance with some embodiments. In some embodiments, the etch stop material layer 170a is a multilayer structure having metal layers (e.g., Ta layers) alternatively stacked with metal oxide layers (e.g., TaO layers).

The thickness of each metal layer or each metal oxide layer ranges from about 40 Å to about 160 Å, in accordance with some embodiments. The etch stop material layer 170a is formed using a physical vapor deposition process, in accordance with some embodiments.

As shown in FIG. 1A, a device material layer 180a is formed over the etch stop material layer 170a, in accordance with some embodiments. The device material layer 180a has portions 182a and 184a, in accordance with some embodiments. The portion 182a covers the weak portion 170w of the etch stop material layer 170a and the undesired particle R, in accordance with some embodiments. The portion 182a is over the conductive pad 130, in accordance with some embodiments.

The device material layer 180a and the etch stop material layer 170a are made of different materials, in accordance with some embodiments. The device material layer 180a is made of a metal-containing material, such as an electromagnetic induction material, in accordance with some embodiments.

The electromagnetic induction material includes a CZT material including cobalt (Co), zirconium (Zr), and tantalum (Ta), in accordance with some embodiments. The device material layer 180a is formed using a physical vapor deposition process, a chemical vapor deposition process, or an atomic layer deposition process, in accordance with some embodiments.

As shown in FIG. 1A, a mask layer 190 is formed over the portion 184a of the device material layer 180a, in accordance with some embodiments. The mask layer 190 and the device material layer 180a are made of different materials, in accordance with some embodiments. The mask layer 190 is made of a polymer material, such as a photoresist material, in accordance with some embodiments.

As shown in FIGS. 1A and 1B, the portion 182a of the device material layer 180a is removed, in accordance with some embodiments. The remaining device material layer 180a (i.e., the portion 184a) forms a device element 180, in accordance with some embodiments. The device element 180 is an inductor device, in accordance with some embodiments. The inductor device is used in a coupling line voltage regulator (CLVR), in accordance with some embodiments. The removal process includes a wet etching process, in accordance with some embodiments. The etch solution includes nitric acid and hydrofluoric acid, in accordance with some embodiments.

Since the etch resistance of the weak portion 170w of the etch stop material layer 170a is poor, the etch solution etches through or flows through the weak portion 170w, in accordance with some embodiments. Therefore, the etch solution etches away a portion of the buffer material layer 160a under the weak portion 170w and forms a hole H in the buffer material layer 160a, in accordance with some embodiments.

Since the buffer material layer 160a is thick enough, the hole H does not pass through the buffer material layer 160a, in accordance with some embodiments. Therefore, the increase in the thickness T160a of the buffer material layer 160a prevents the conductive pad 130 from being etched and improves the yield of the removal process, in accordance with some embodiments.

The increase in the thickness T160a of the buffer material layer 160a improves the etch resistance, which lowers the cleanliness requirement to the processes for forming the elements under the etch stop material layer 170a, in accordance with some embodiments.

As shown in FIGS. 1B and 1C, the undesired particle R, the etch stop material layer 170a exposed by the mask layer 190 and the device element 180, the buffer material layer 160a thereunder, and the glue material layer 150a thereunder are removed, in accordance with some embodiments.

As shown in FIGS. 1B and 1C, the mask layer 190 is removed, in accordance with some embodiments. In this step, a chip structure 100 is substantially formed, in accordance with some embodiments.

In some embodiments, the mask layer 190 is removed during removing the undesired particle R, the etch stop material layer 170a exposed by the device element 180, the buffer material layer 160a thereunder, and the glue material layer 150a thereunder. In some other embodiments, the mask layer 190 is removed after removing the undesired particle R, the etch stop material layer 170a exposed by the device element 180, the buffer material layer 160a thereunder, and the glue material layer 150a thereunder.

After the removal process, the remaining glue material layer 150a forms a glue layer 150, the remaining buffer material layer 160a forms a buffer layer 160, and the remaining etch stop material layer 170a forms an etch stop layer 170, in accordance with some embodiments. The removal process includes an etching process, such as a dry etching process, in accordance with some embodiments.

Figure 2A:
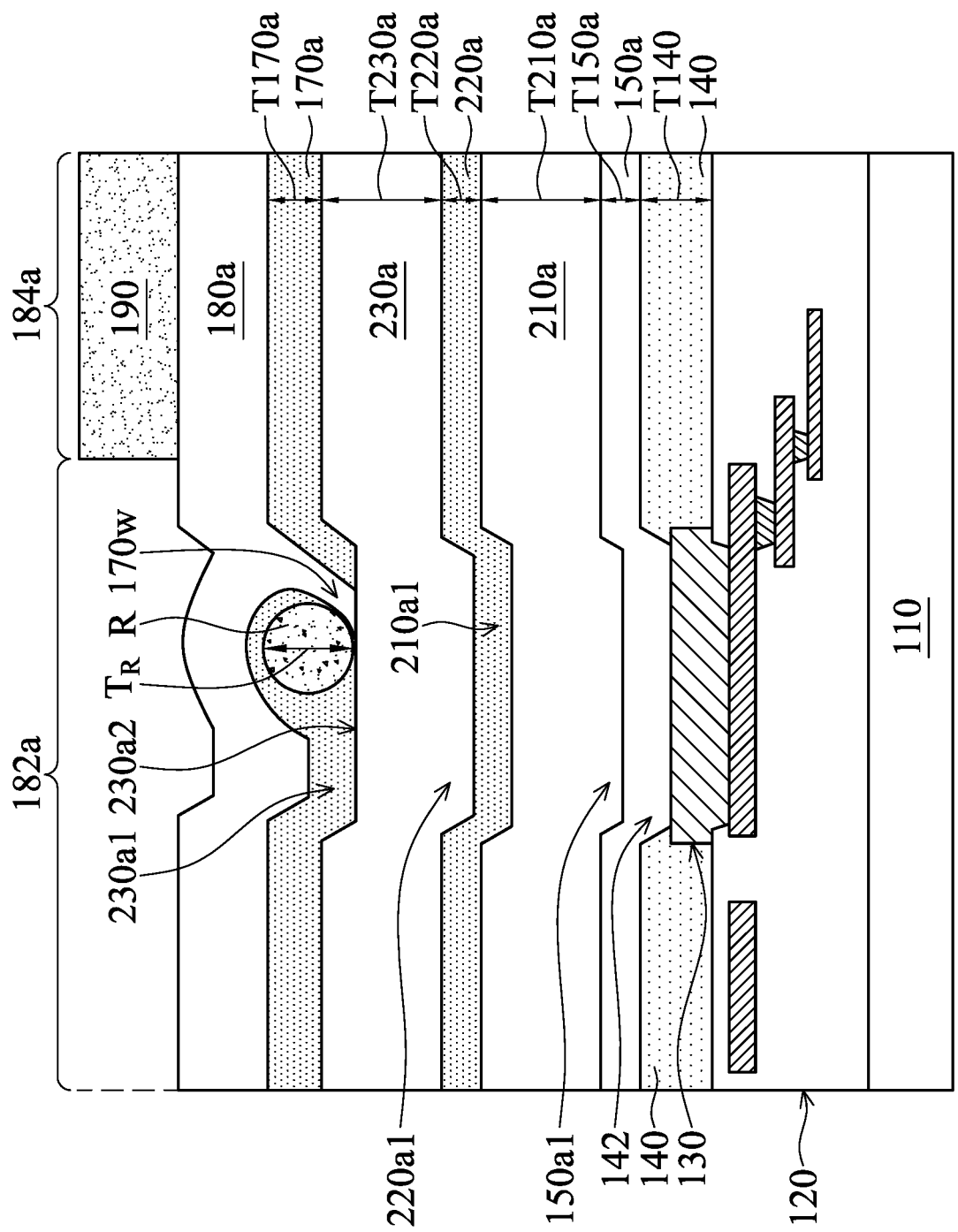
FIGS. 2A-2C are cross-sectional views of various stages of a process for forming a chip structure, in accordance with some embodiments.
Figures 1, 2A:
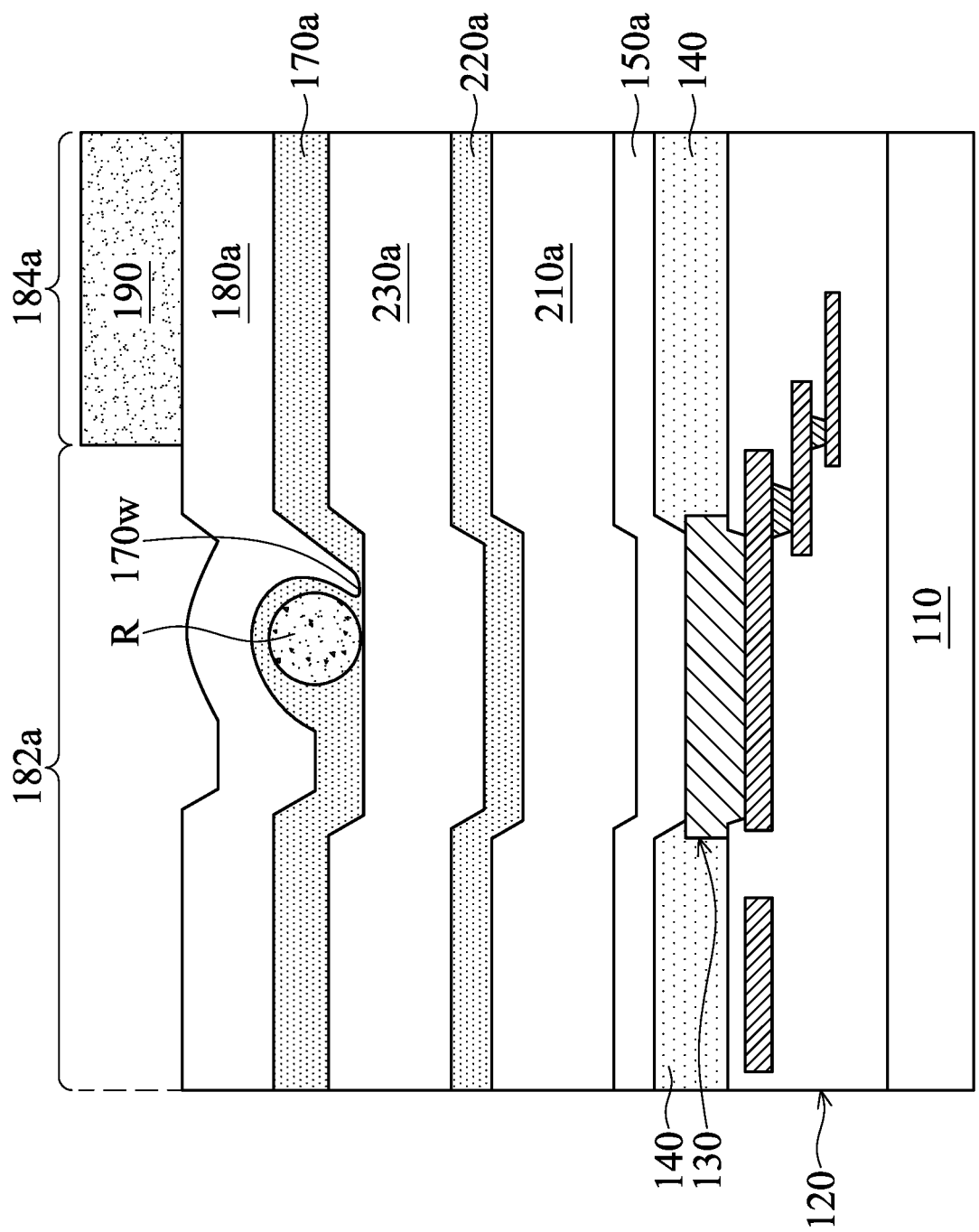
Figure 2B:
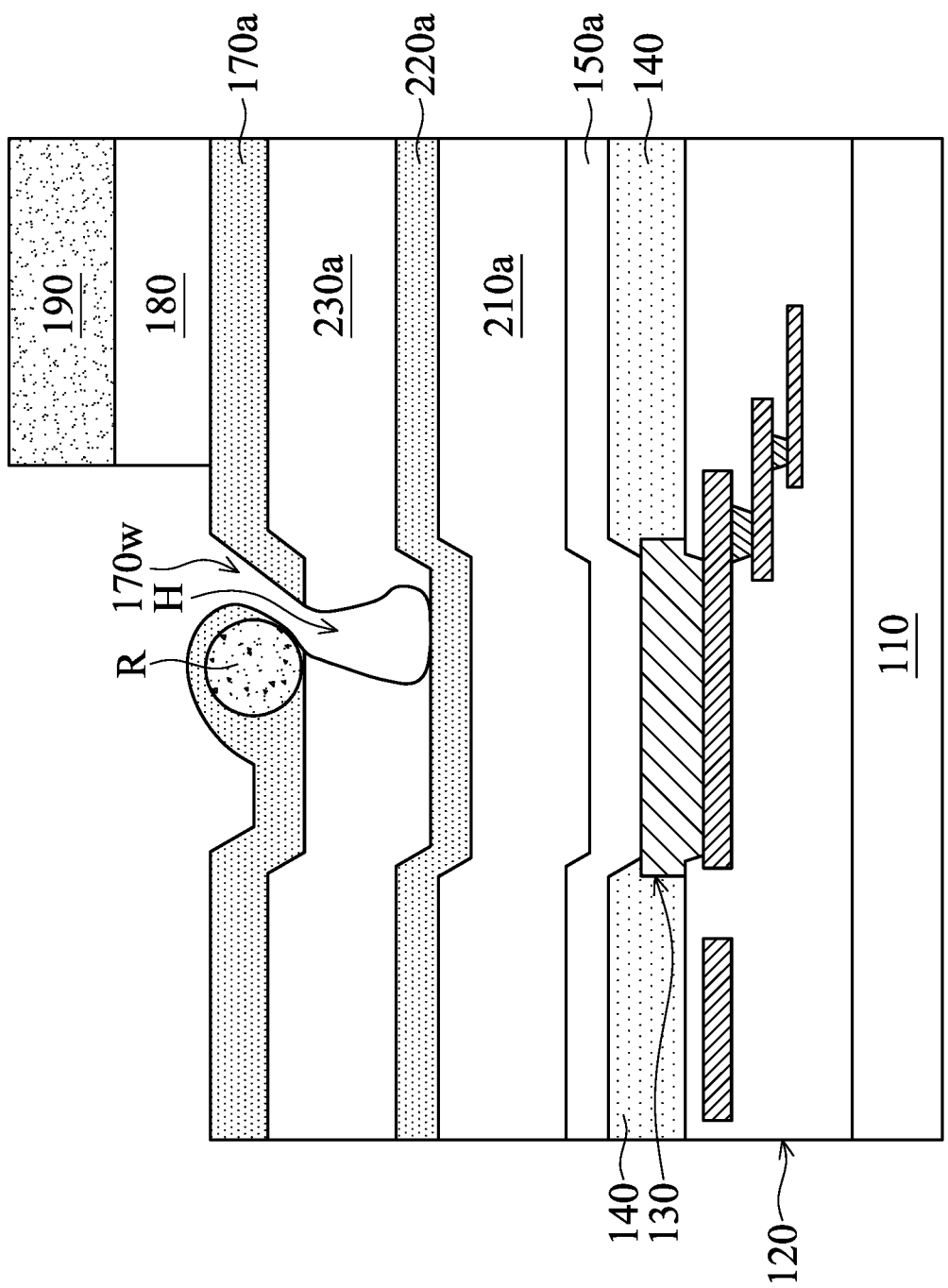
Figure 2C:
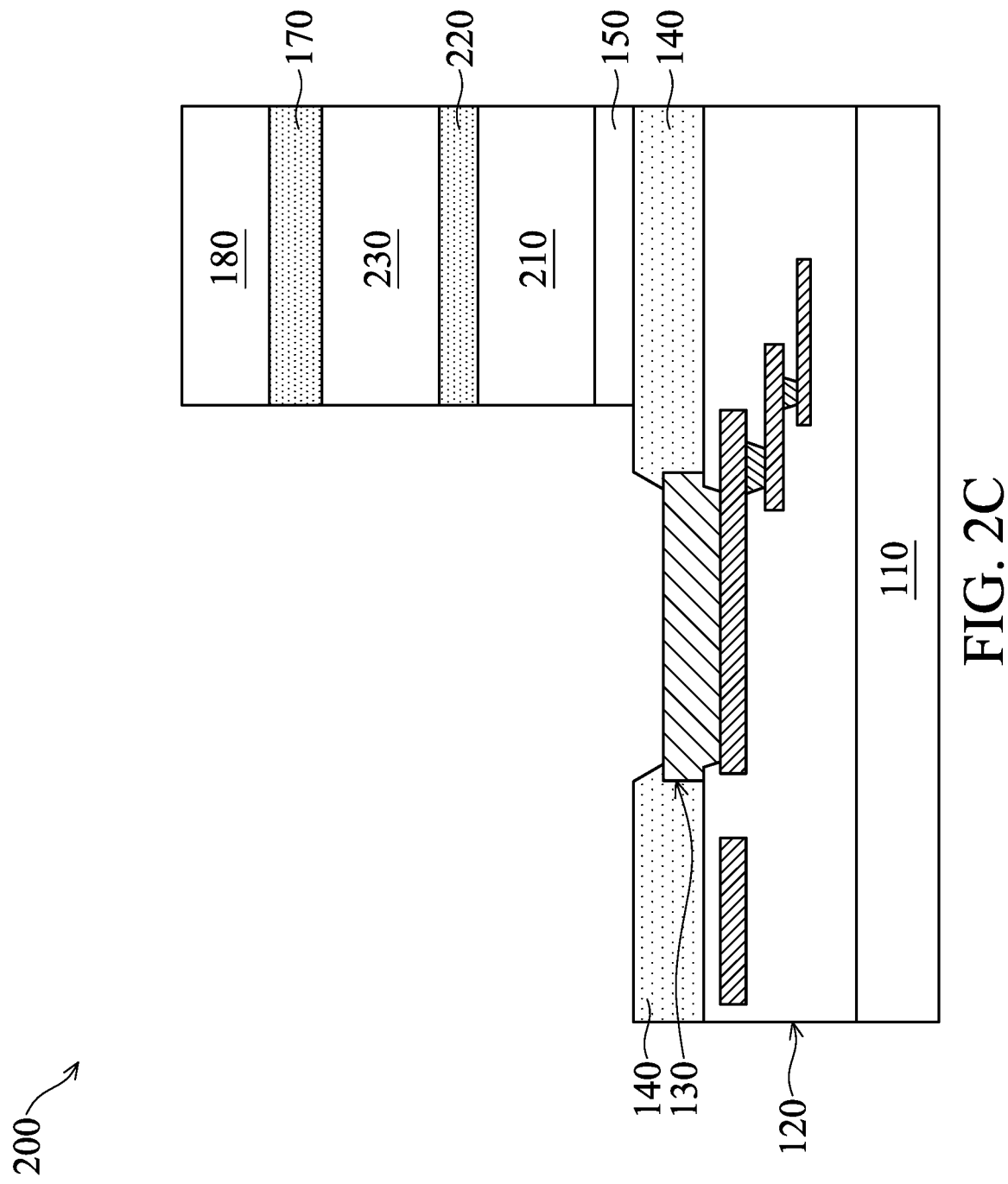

FIGS. 2A-2C are cross-sectional views of various stages of a process for forming a chip structure, in accordance with some embodiments. As shown in FIG. 2A, the step of FIG. 1A is performed to form the substrate 110, the interconnect structure 120, the conductive pads 130, the passivation layer 140, and the glue material layer 150a, in accordance with some embodiments.

As shown in FIG. 2A, a buffer material layer 210a is formed over the glue material layer 150a, in accordance with some embodiments. The buffer material layer 210a has a recess 210a1 over the recess 150a1 of the glue material layer 150a, in accordance with some embodiments. The buffer material layer 210a is used as an anti-warpage layer to reduce the warpage of the substrate 110, in accordance with some embodiments.

The buffer material layer 210a is thicker than the glue material layer 150a, in accordance with some embodiments. The buffer material layer 210a is thinner than the passivation layer 140, in accordance with some embodiments. The thickness T140 of the passivation layer 140 ranges from about 3 μm to about 10 μm, in accordance with some embodiments. The thickness T210a of the buffer material layer 210a shown in FIG. 2A may be exaggerated for clarity and the convenience of labeling.

The thickness T210a of the buffer material layer 210a ranges from about 500 Å to about 1500 Å, in accordance with some embodiments. The buffer material layer 210a is made of a silicon-containing material, such as silicon nitride or silicon oxide, in accordance with some embodiments.

The buffer material layer 210a is formed using a chemical vapor deposition process, such as a low-pressure chemical vapor deposition process, a plasma-enhanced chemical vapor deposition process, or a high-density plasma chemical vapor deposition process, an atomic layer deposition process, a spin-on process, a physical vapor deposition process, or another suitable process.

As shown in FIG. 2A, an etch stop material layer 220a is formed over the buffer material layer 210a, in accordance with some embodiments. The etch stop material layer 220a conformally covers the buffer material layer 210a and therefore has a recess 220a1, in accordance with some embodiments.

The etch stop material layer 220a and the buffer material layer 210a are made of different materials, which improves an etching selectivity of the etch stop material layer 220a to the buffer material layer 210a, in accordance with some embodiments. The etch resistance of the material of the etch stop material layer 220a is greater than the etch resistance of the material of the buffer material layer 210a, in accordance with some embodiments.

For example, in a subsequent wet etching process, an etch rate ratio of the buffer material layer 210a to the etch stop material layer 220a ranges from about 10 to about 20, in accordance with some embodiments. The buffer material layer 210a is thicker than the etch stop material layer 220a, in accordance with some embodiments. In some other embodiments, the buffer material layer 210a and the etch stop material layer 220a have the same thickness.

The thickness T220a of the etch stop material layer 220a ranges from about 300 Å to about 1000 Å, in accordance with some embodiments. The thickness T220a of the etch stop material layer 220a ranges from about 400 Å to about 600 Å, in accordance with some embodiments.

The etch stop material layer 220a is made of a metal-containing material, such as tantalum (Ta) and tantalum oxide (TaO), or a polymer material, such as polyimide, in accordance with some embodiments. In some embodiments, the etch stop material layer 220a is a multilayer structure having metal layers (e.g., Ta layers) alternatively stacked with metal oxide layers (e.g., TaO layers).

The thickness of each metal layer or each metal oxide layer ranges from about 40 Å to about 160 Å, in accordance with some embodiments. The etch stop material layer 220a is formed using a physical vapor deposition process, in accordance with some embodiments.

As shown in FIG. 2A, a buffer material layer 230a is formed over the etch stop material layer 220a, in accordance with some embodiments. The buffer material layer 230a has a recess 230a1 over the recess 220a1 of the etch stop material layer 220a, in accordance with some embodiments. The buffer material layer 230a is used as an anti-warpage layer to reduce the warpage of the substrate 110, in accordance with some embodiments.

The buffer material layer 230a is thicker than the etch stop material layer 220a, in accordance with some embodiments. In some other embodiments, the buffer material layer 230a and the etch stop material layer 220a have the same thickness. The buffer material layers 210a and 230a have the same thickness, in accordance with some embodiments.

The buffer material layer 230a is thinner than the passivation layer 140, in accordance with some embodiments. The thickness T230a of the buffer material layer 230a shown in FIG. 2A may be exaggerated for clarity and the convenience of labeling.

The thickness T230a of the buffer material layer 230a ranges from about 500 Å to about 1500 Å, in accordance with some embodiments. The buffer material layer 230a is made of a silicon-containing material, such as silicon nitride or silicon oxide, in accordance with some embodiments. The buffer material layers 210a and 230a are made of the same material, in accordance with some embodiments.

The buffer material layer 230a is formed using a chemical vapor deposition process, such as a low-pressure chemical vapor deposition process, a plasma-enhanced chemical vapor deposition process, or a high-density plasma chemical vapor deposition process, an atomic layer deposition process, a spin-on process, a physical vapor deposition process, or another suitable process.

As shown in FIG. 2A, there is an undesired particle R in the recess 230a1 of the buffer material layer 230a, in accordance with some embodiments. The undesired particle R may come from the contamination in a processing chamber. The thickness $T_R$ of the undesired particle R ranges from about 300 Å to about 4000 Å, in accordance with some embodiments. The undesired particle R includes carbon, nitride, or another material, in accordance with some embodiments.

As shown in FIG. 2A, an etch stop material layer 170a is formed over the buffer material layer 230a and the undesired particle R, in accordance with some embodiments. The etch stop material layer 170a conformally covers the buffer material layer 230a and the undesired particle R, in accordance with some embodiments. A ratio of the thickness $T_R$ of the undesired particle R to the thickness T170a of the etch stop material layer 170a ranges from about 0.5 to about 6, in accordance with some embodiments.

Since the height difference (e.g., the thickness $T_R$) between a top of the undesired particle R and a surface 230a2 of the buffer material layer 230a is very large, the etch stop material layer 170a is prone to have a weak portion 170w adjacent to the undesired particle R, in accordance with some embodiments. In some embodiments, as shown in FIG. 2A, the weak portion 170w is a hole, which passes through the etch stop material layer 170a.

FIG. 2A-1 is a cross-sectional view of a stage of a process for forming a chip structure, in accordance with some embodiments. In some other embodiments, as shown in FIG. 2A-1, the weak portion 170w is a thin portion, which is thinner than other portions of the etch stop material layer 170a. That is, the weak portion 170w is the thinnest portion of the etch stop material layer 170a, in accordance with some embodiments.

The etch stop material layer 170a and the buffer material layer 230a are made of different materials, which improves an etching selectivity of the etch stop material layer 170a to the buffer material layer 230a, in accordance with some embodiments.

The etch resistance of the material of the etch stop material layer 170a is greater than the etch resistance of the material of the buffer material layer 230a, in accordance with some embodiments. For example, in a subsequent wet etching process, an etch rate ratio of the buffer material layer 230a to the etch stop material layer 170a ranges from about 10 to about 20, in accordance with some embodiments.

The etch stop material layer 170a is used as a main etch stop layer, and the etch stop material layer 220a is used as a back-up etch stop layer, in accordance with some embodiments. The etch stop material layer 170a is thicker than the etch stop material layer 220a, in accordance with some embodiments.

The buffer material layer 210a or 230a is thicker than both the etch stop material layers 170a and 220a, in accordance with some embodiments. As shown in FIG. 2A, the thickness T170a of the etch stop material layer 170a ranges from about 400 Å to about 900 Å, in accordance with some embodiments.

In some embodiments, a sum of the thicknesses T150a, T210a, T220a, T230a, and T170a of the glue material layer 150a, the buffer material layer 210a, the etch stop material layer 220a, the buffer material layer 230a, and the etch stop material layer 170a ranges from about 8000 Å to about 13000 Å.

The etch stop material layer 170a is made of a metal-containing material, such as tantalum (Ta) and tantalum oxide (TaO), or a polymer material, such as polyimide, in accordance with some embodiments. In some embodiments, the etch stop material layers 170a and 220a are made of the same material.

In some embodiments, the etch stop material layer 170a is a multilayer structure having metal layers (e.g., Ta layers) alternatively stacked with metal oxide layers (e.g., TaO layers). The thickness of each metal layer or each metal oxide layer ranges from about 40 Å to about 160 Å, in accordance with some embodiments. The etch stop material layer 170a is formed using a physical vapor deposition process, in accordance with some embodiments.

As shown in FIG. 2A, a device material layer 180a is formed over the etch stop material layer 170a, in accordance with some embodiments. The device material layer 180a has portions 182a and 184a, in accordance with some embodiments. The portion 182a covers the weak portion 170w of the etch stop material layer 170a and the undesired particle R, in accordance with some embodiments. The portion 182a is over the conductive pad 130, in accordance with some embodiments.

The device material layer 180a and the etch stop material layer 170a are made of different materials, in accordance with some embodiments. The device material layer 180a is made of a metal-containing material, such as an electromagnetic induction material, in accordance with some embodiments.

The electromagnetic induction material includes a CZT material including cobalt (Co), zirconium (Zr), and tantalum (Ta), in accordance with some embodiments. The device material layer 180a is formed using a physical vapor deposition process, a chemical vapor deposition process, or an atomic layer deposition process, in accordance with some embodiments.

As shown in FIG. 2A, a mask layer 190 is formed over the portion 184a of the device material layer 180a, in accordance with some embodiments. The mask layer 190 and the device material layer 180a are made of different materials, in accordance with some embodiments. The mask layer 190 is made of a polymer material, such as a photoresist material, in accordance with some embodiments.

As shown in FIGS. 2A and 2B, the portion 182a of the device material layer 180a is removed, in accordance with some embodiments. The remaining device material layer 180a (i.e., the portion 184a) forms a device element 180, in accordance with some embodiments. The device element 180 is an inductor device, in accordance with some embodiments. The removal process includes a wet etching process, in accordance with some embodiments. The etch solution includes nitric acid and hydrofluoric acid, in accordance with some embodiments.

Since the etch resistance of the weak portion 170w of the etch stop material layer 170a is poor, the etch solution etches through or flows through the weak portion 170w, in accordance with some embodiments. Therefore, the etch solution etches away a portion of the buffer material layer 230a under the weak portion 170w and therefore forms a hole H in the buffer material layer 230a, in accordance with some embodiments.

Since the etch stop material layer 220a is formed, the etching process stops at the etch stop material layer 220a, in accordance with some embodiments. Therefore, the formation of the etch stop material layer 220a prevents the conductive pad 130 from being etched and improves the yield of the removal process, in accordance with some embodiments. Furthermore, the formation of the etch stop material layer 220a lowers the cleanliness requirement to the processes for forming the elements under the etch stop material layer 170a, in accordance with some embodiments.

As shown in FIGS. 2B and 2C, the undesired particle R, the etch stop material layer 170a exposed by the mask layer 190 and the device element 180, the buffer material layer 230a thereunder, the etch stop material layer 220a thereunder, the buffer material layer 210a thereunder, and the glue material layer 150a thereunder are removed, in accordance with some embodiments.

As shown in FIGS. 2B and 2C, the mask layer 190 is removed, in accordance with some embodiments. In this step, a chip structure 200 is substantially formed, in accordance with some embodiments.

In some embodiments, the mask layer 190 is removed during removing the undesired particle R, the etch stop material layer 170a exposed by the device element 180, the buffer material layer 230a thereunder, the etch stop material layer 220a thereunder, the buffer material layer 210a thereunder, and the glue material layer 150a thereunder.

In some other embodiments, the mask layer 190 is removed after removing the undesired particle R, the etch stop material layer 170a exposed by the device element 180, the buffer material layer 230a thereunder, the etch stop material layer 220a thereunder, the buffer material layer 210a thereunder, and the glue material layer 150a thereunder.

After the removal process, the remaining glue material layer 150a forms a glue layer 150, the remaining buffer material layer 210a forms a buffer layer 210, and the remaining etch stop material layer 220a forms an etch stop layer 220, the remaining buffer material layer 230a forms a buffer layer 230, and the remaining etch stop material layer 170a forms an etch stop layer 170, in accordance with some embodiments. The removal process includes an etching process, such as a dry etching process, in accordance with some embodiments.

Figure 3A:
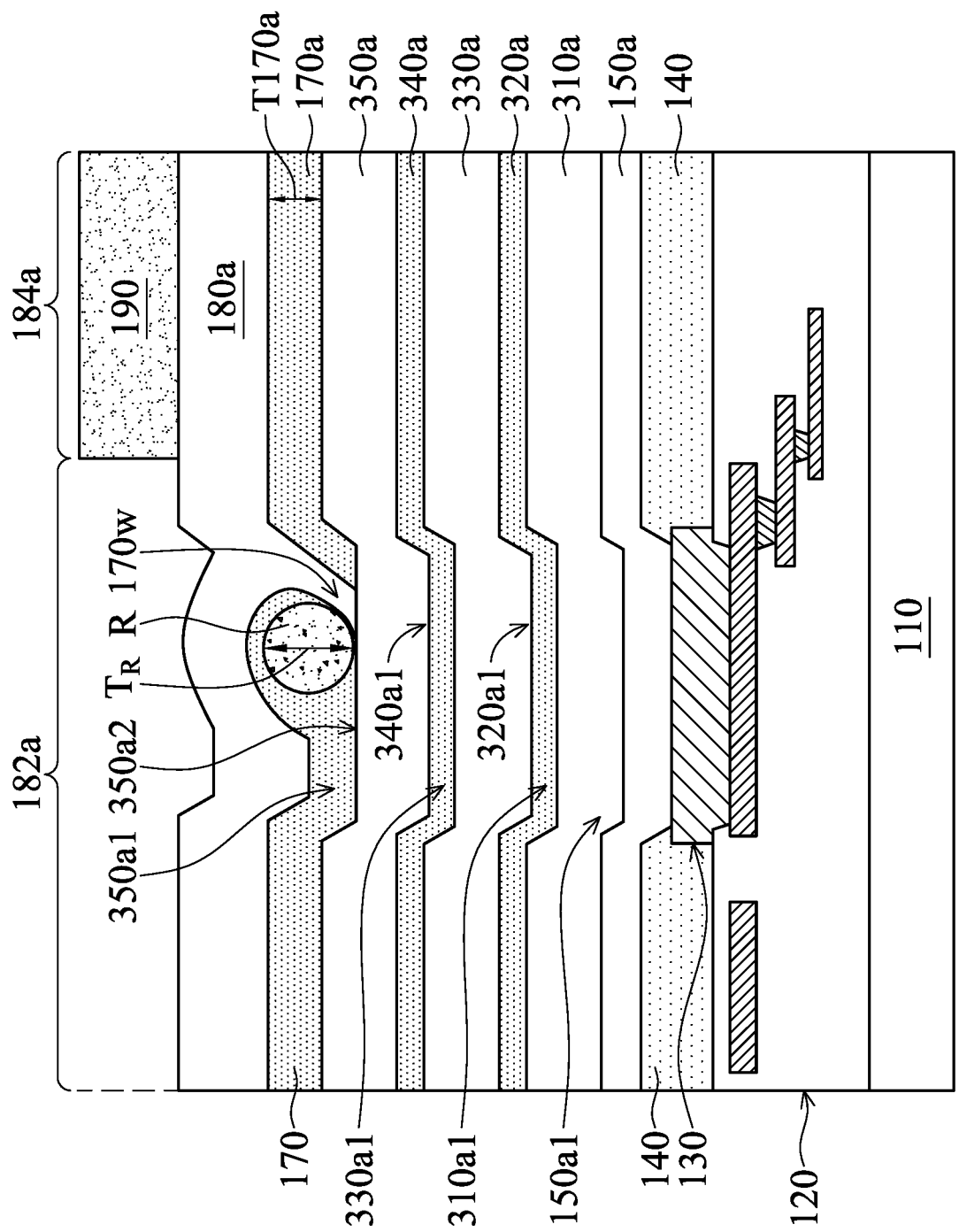
FIGS. 3A-3C are cross-sectional views of various stages of a process for forming a chip structure, in accordance with some embodiments.
Figures 1, 3A:
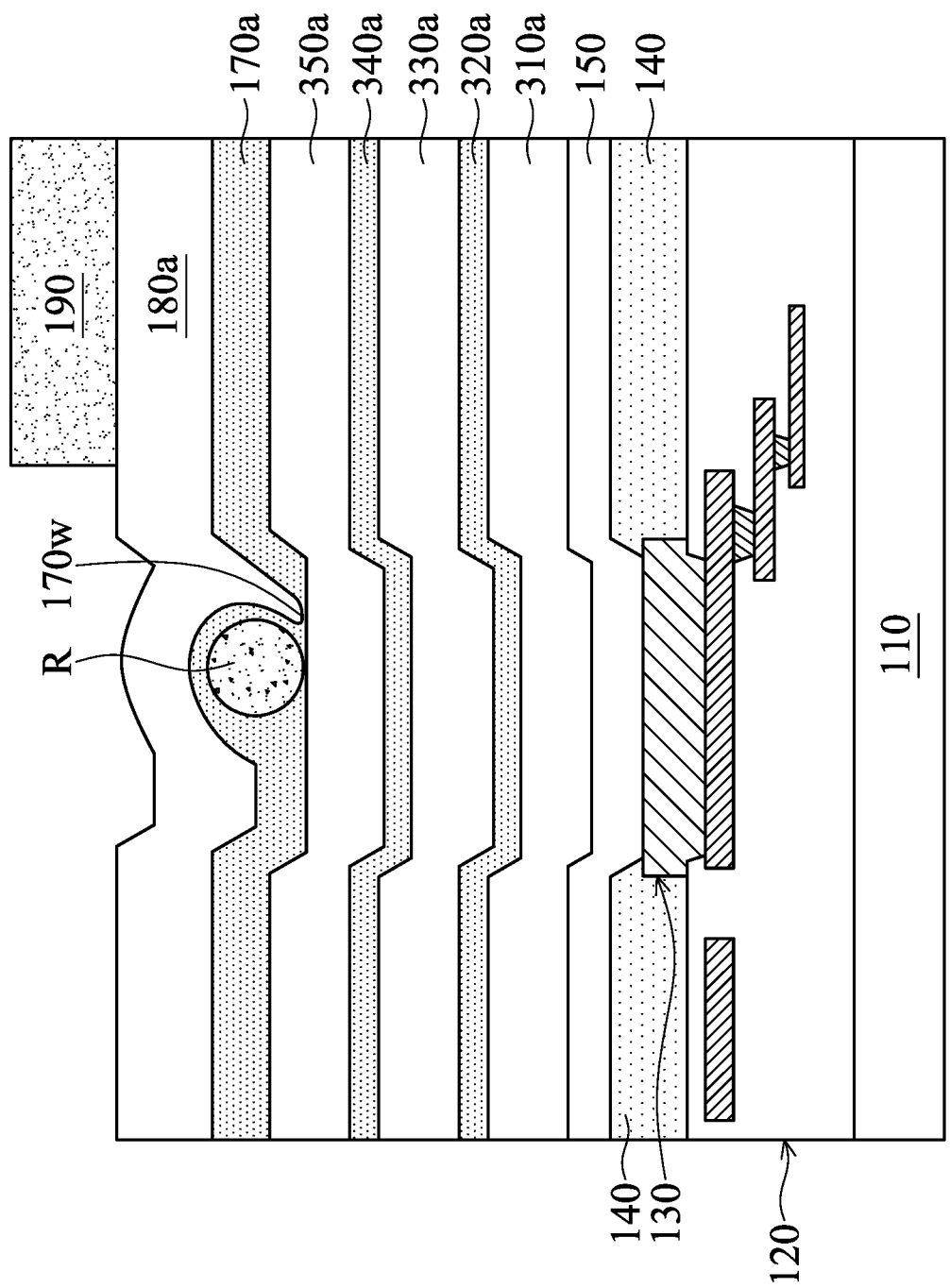
Figure 3B:
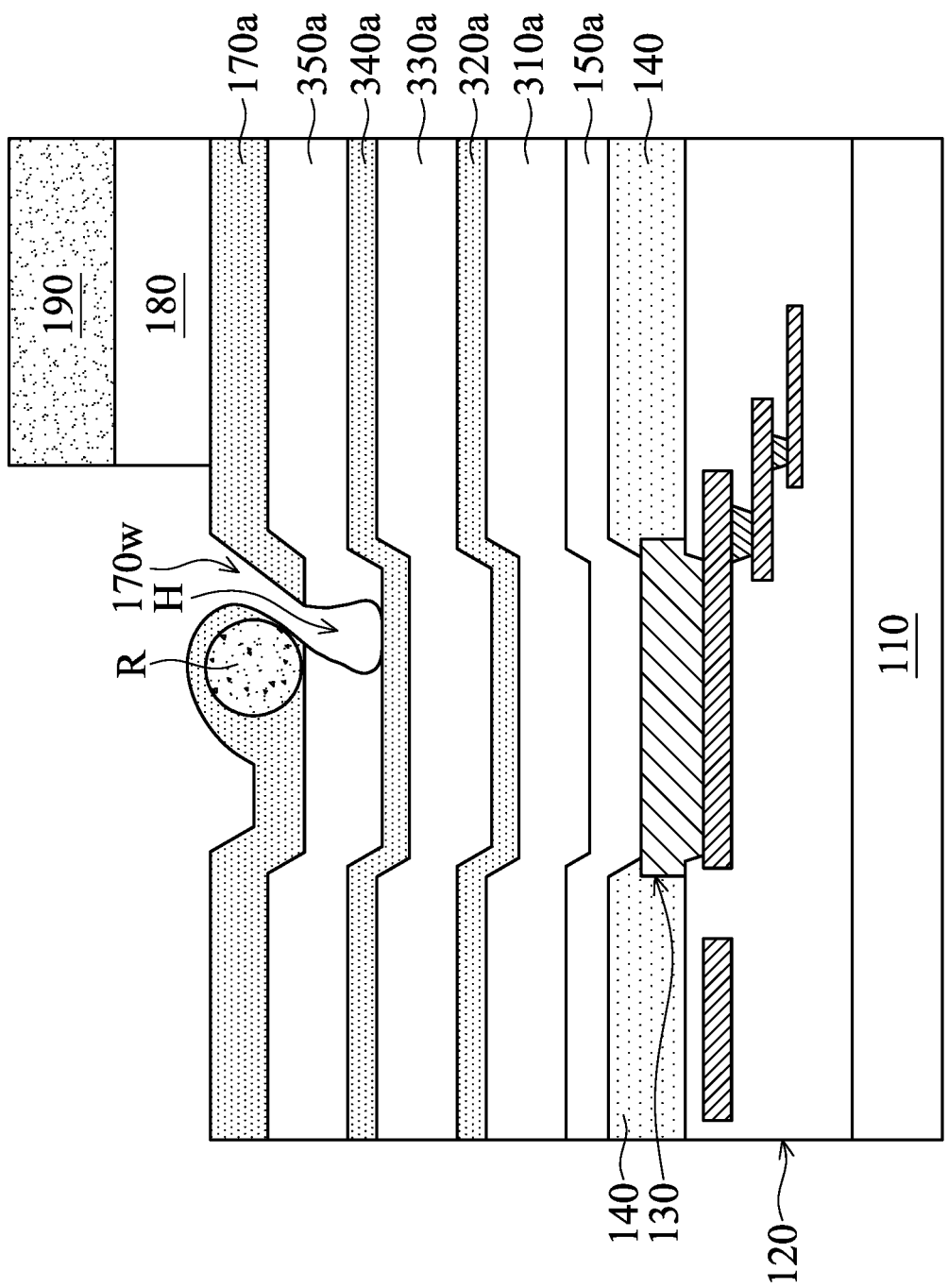
Figure 3C:
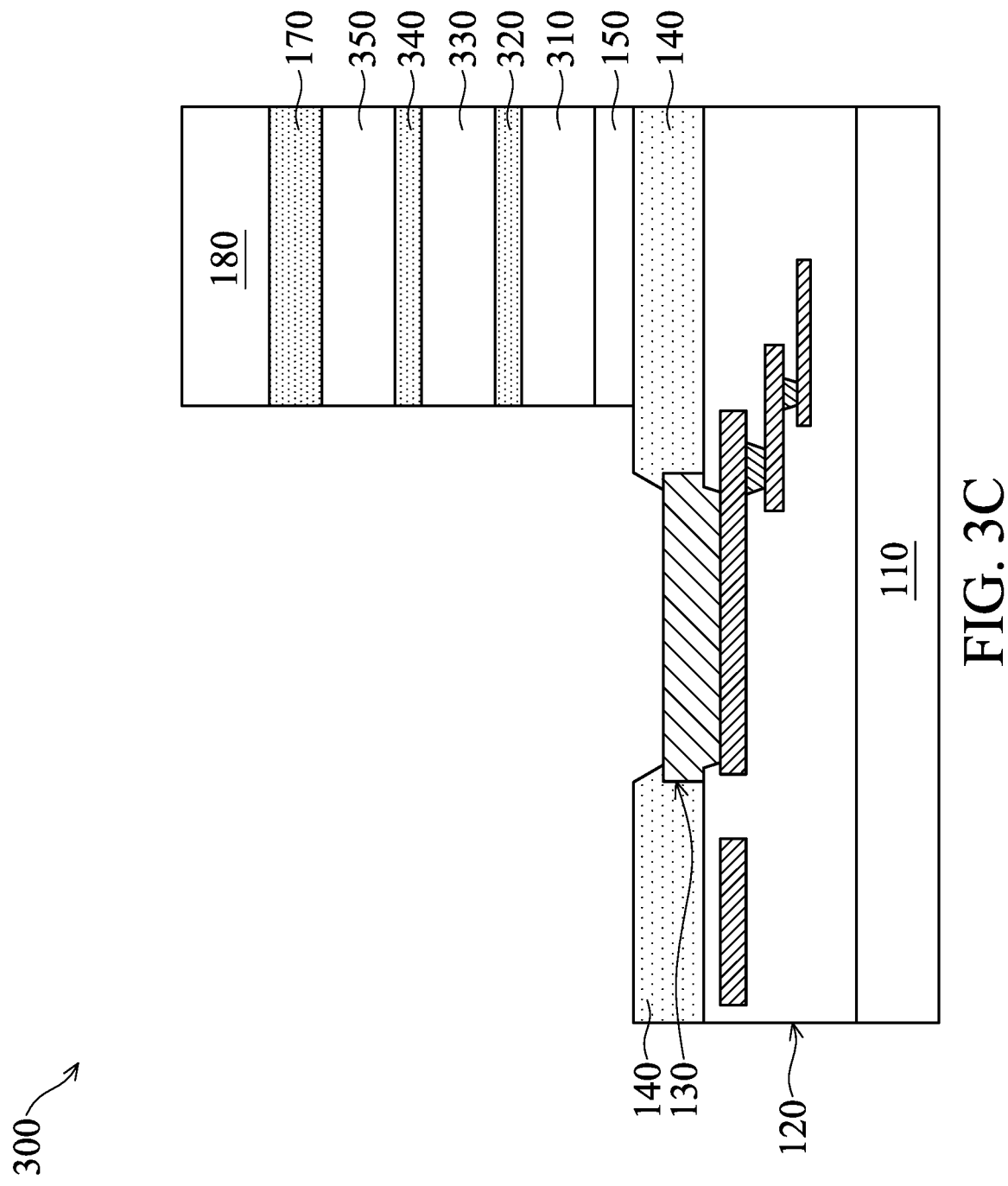

FIGS. 3A-3C are cross-sectional views of various stages of a process for forming a chip structure, in accordance with some embodiments. As shown in FIG. 3A, the step of FIG. 1A is performed to form the substrate 110, the interconnect structure 120, the conductive pads 130, the passivation layer 140, and the glue material layer 150a, in accordance with some embodiments.

As shown in FIG. 3A, a buffer material layer 310a is formed over the glue material layer 150a, in accordance with some embodiments. The buffer material layer 310a has a recess 310a1 over the recess 150a1 of the glue material layer 150a, in accordance with some embodiments. The buffer material layer 310a is used as an anti-warpage layer to reduce the warpage of the substrate 110, in accordance with some embodiments.

The buffer material layer 310a is thicker than the glue material layer 150a, in accordance with some embodiments. The buffer material layer 310a is thinner than the passivation layer 140, in accordance with some embodiments. The thickness of the buffer material layer 310a shown in FIG. 3A may be exaggerated for clarity and the convenience of labeling.

The buffer material layer 310a is made of a silicon-containing material, such as silicon nitride or silicon oxide, in accordance with some embodiments. The buffer material layer 310a is formed using a chemical vapor deposition process, such as a low-pressure chemical vapor deposition process, a plasma-enhanced chemical vapor deposition process, or a high-density plasma chemical vapor deposition process, an atomic layer deposition process, a spin-on process, a physical vapor deposition process, or another suitable process.

As shown in FIG. 3A, an etch stop material layer 320a is formed over the buffer material layer 310a, in accordance with some embodiments. The etch stop material layer 320a conformally covers the buffer material layer 310a and therefore has a recess 320a1, in accordance with some embodiments.

The etch stop material layer 320a and the buffer material layer 310a are made of different materials, which improves an etching selectivity of the etch stop material layer 320a to the buffer material layer 310a, in accordance with some embodiments. The etch resistance of the material of the etch stop material layer 320a is greater than the etch resistance of the material of the buffer material layer 310a, in accordance with some embodiments. For example, in a subsequent wet etching process, an etch rate ratio of the buffer material layer 310a to the etch stop material layer 320a ranges from about 10 to about 20, in accordance with some embodiments.

The etch stop material layer 320a is made of a metal-containing material, such as tantalum (Ta) and tantalum oxide (TaO), or a polymer material, such as polyimide, in accordance with some embodiments. In some embodiments, the etch stop material layer 320a is a multilayer structure having metal layers (e.g., Ta layers) alternatively stacked with metal oxide layers (e.g., TaO layers). The etch stop material layer 320a is formed using a physical vapor deposition process, in accordance with some embodiments.

As shown in FIG. 3A, a buffer material layer 330a is formed over the etch stop material layer 320a, in accordance with some embodiments. The buffer material layer 330a has a recess 330a1 over the recess 320a1 of the etch stop material layer 320a, in accordance with some embodiments. The buffer material layer 330a is used as an anti-warpage layer to reduce the warpage of the substrate 110, in accordance with some embodiments.

The buffer material layer 330a is thicker than the glue material layer 150a, in accordance with some embodiments. The buffer material layer 330a is thinner than the passivation layer 140, in accordance with some embodiments. The thickness of the buffer material layer 330a shown in FIG. 3A may be exaggerated for clarity and the convenience of labeling.

The buffer material layer 330a is made of a silicon-containing material, such as silicon nitride or silicon oxide, in accordance with some embodiments. The buffer material layer 330a is formed using a chemical vapor deposition process, such as a low-pressure chemical vapor deposition process, a plasma-enhanced chemical vapor deposition process, or a high-density plasma chemical vapor deposition process, an atomic layer deposition process, a spin-on process, a physical vapor deposition process, or another suitable process.

As shown in FIG. 3A, an etch stop material layer 340a is formed over the buffer material layer 330a, in accordance with some embodiments. The etch stop material layer 340a conformally covers the buffer material layer 330a and therefore has a recess 340a1, in accordance with some embodiments.

The etch stop material layer 340a and the buffer material layer 330a are made of different materials, which improves an etching selectivity of the etch stop material layer 340a to the buffer material layer 330a, in accordance with some embodiments. The etch resistance of the material of the etch stop material layer 340a is greater than the etch resistance of the material of the buffer material layer 330a, in accordance with some embodiments.

For example, in a subsequent wet etching process, an etch rate ratio of the buffer material layer 330a to the etch stop material layer 340a ranges from about 10 to about 20, in accordance with some embodiments. The buffer material layer 330a is thicker than the etch stop material layer 320a or 340a, in accordance with some embodiments.

The etch stop material layer 340a is made of a metal-containing material, such as tantalum (Ta) and tantalum oxide (TaO), or a polymer material, such as polyimide, in accordance with some embodiments. In some embodiments, the etch stop material layer 340a is a multilayer structure having metal layers (e.g., Ta layers) alternatively stacked with metal oxide layers (e.g., TaO layers). The etch stop material layer 340a is formed using a physical vapor deposition process, in accordance with some embodiments.

As shown in FIG. 3A, a buffer material layer 350a is formed over the etch stop material layer 340a, in accordance with some embodiments. The buffer material layer 350a has a recess 350a1 over the recess 340a1 of the etch stop material layer 340a, in accordance with some embodiments. The buffer material layer 350a is used as an anti-warpage layer to reduce the warpage of the substrate 110, in accordance with some embodiments.

The buffer material layer 350a is thicker than the etch stop material layer 320a or 340a, in accordance with some embodiments. The buffer material layer 350a is thinner than the passivation layer 140, in accordance with some embodiments. The thickness of the buffer material layer 350a shown in FIG. 3A may be exaggerated for clarity and the convenience of labeling.

The buffer material layer 350a is made of a silicon-containing material, such as silicon nitride or silicon oxide, in accordance with some embodiments. The buffer material layers 310a, 330a, and 350a are made of the same material, in accordance with some embodiments.

The buffer material layer 350a is formed using a chemical vapor deposition process, such as a low-pressure chemical vapor deposition process, a plasma-enhanced chemical vapor deposition process, or a high-density plasma chemical vapor deposition process, an atomic layer deposition process, a spin-on process, a physical vapor deposition process, or another suitable process.

As shown in FIG. 3A, there is an undesired particle R in the recess 350a1 of the buffer material layer 350a, in accordance with some embodiments. The undesired particle R may come from the contamination in a processing chamber. The undesired particle R includes carbon, nitride, or another material, in accordance with some embodiments.

As shown in FIG. 3A, an etch stop material layer 170a is formed over the buffer material layer 350a and the undesired particle R, in accordance with some embodiments. The etch stop material layer 170a conformally covers the buffer material layer 350a and the undesired particle R, in accordance with some embodiments. A ratio of the thickness $T_R$ of the undesired particle R to the thickness T170a of the etch stop material layer 170a ranges from about 0.5 to about 6, in accordance with some embodiments.

Since the height difference (e.g., the thickness $T_R$) between a top of the undesired particle R and a surface 350a2 of the buffer material layer 350a is very large, the etch stop material layer 170a is prone to have a weak portion 170w adjacent to the undesired particle R, in accordance with some embodiments. In some embodiments, as shown in FIG. 3A, the weak portion 170w is a hole, which passes through the etch stop material layer 170a.

FIG. 3A-1 is a cross-sectional view of a stage of a process for forming a chip structure, in accordance with some embodiments. In some other embodiments, as shown in FIG. 3A-1, the weak portion 170w is a thin portion, which is thinner than other portions of the etch stop material layer 170a. That is, the weak portion 170w is the thinnest portion of the etch stop material layer 170a, in accordance with some embodiments.

The etch stop material layer 170a and the buffer material layer 350a are made of different materials, which improves an etching selectivity of the etch stop material layer 170a to the buffer material layer 350a, in accordance with some embodiments. The etch resistance of the material of the etch stop material layer 170a is greater than the etch resistance of the material of the buffer material layer 350a, in accordance with some embodiments.

For example, in a subsequent wet etching process, an etch rate ratio of the buffer material layer 350a to the etch stop material layer 170a ranges from about 10 to about 20, in accordance with some embodiments. The buffer material layer 350a is thicker than the etch stop material layer 170a, in accordance with some embodiments.

The etch stop material layer 170a is used as a main etch stop layer, and the etch stop material layers 320a and 340a are used as back-up etch stop layers, in accordance with some embodiments. The etch stop material layer 170a is thicker than both the etch stop material layers 320a and 340a, in accordance with some embodiments. The buffer material layer 310a, 330a, or 350a is thicker than both the etch stop material layers 320a and 340a, in accordance with some embodiments.

In some embodiments, a sum of the thicknesses of the glue material layer 150a, the buffer material layer 310a, the etch stop material layer 320a, the buffer material layer 330a, the etch stop material layer 340a, the buffer material layer 350a, and the etch stop material layer 170a ranges from about 8000 Å to about 13000 Å.

The etch stop material layer 170a is made of a metal-containing material, such as tantalum (Ta) and tantalum oxide (TaO), or a polymer material, such as polyimide, in accordance with some embodiments. In some embodiments, the etch stop material layers 170a, 320a, and 340a are made of the same material.

In some embodiments, the etch stop material layer 170a is a multilayer structure having metal layers (e.g., Ta layers) alternatively stacked with metal oxide layers (e.g., TaO layers). The etch stop material layer 170a is formed using a physical vapor deposition process, in accordance with some embodiments.

As shown in FIG. 3A, a device material layer 180a is formed over the etch stop material layer 170a, in accordance with some embodiments. The device material layer 180a has portions 182a and 184a, in accordance with some embodiments. The portion 182a covers the weak portion 170w of the etch stop material layer 170a and the undesired particle R, in accordance with some embodiments. The portion 182a is over the conductive pad 130, in accordance with some embodiments.

The device material layer 180a and the etch stop material layer 170a are made of different materials, in accordance with some embodiments. The device material layer 180a is made of a metal-containing material, such as an electromagnetic induction material, in accordance with some embodiments.

The electromagnetic induction material includes a CZT material including cobalt (Co), zirconium (Zr), and tantalum (Ta), in accordance with some embodiments. The device material layer 180a is formed using a physical vapor deposition process, a chemical vapor deposition process, or an atomic layer deposition process, in accordance with some embodiments.

As shown in FIG. 3A, a mask layer 190 is formed over the portion 184a of the device material layer 180a, in accordance with some embodiments. The mask layer 190 and the device material layer 180a are made of different materials, in accordance with some embodiments. The mask layer 190 is made of a polymer material, such as a photoresist material, in accordance with some embodiments.

As shown in FIGS. 3A and 3B, the portion 182a of the device material layer 180a is removed, in accordance with some embodiments. The remaining device material layer 180a (i.e., the portion 184a) forms a device element 180, in accordance with some embodiments. The device element 180 is an inductor device, in accordance with some embodiments. The removal process includes a wet etching process, in accordance with some embodiments. The etch solution includes nitric acid and hydrofluoric acid, in accordance with some embodiments.

Since the etch resistance of the weak portion 170w of the etch stop material layer 170a is poor, the etch solution etches through or flows through the weak portion 170w, in accordance with some embodiments. Therefore, the etch solution etches away a portion of the buffer material layer 350a under the weak portion 170w and forms a hole H in the buffer material layer 350a, in accordance with some embodiments.

Since the etch stop material layer 340a is formed, the etching process stops at the etch stop material layer 340a, in accordance with some embodiments. Therefore, the formation of the etch stop material layer 340a prevents the conductive pad 130 from being etched and improves the yield of the removal process, in accordance with some embodiments. Furthermore, the formation of the etch stop material layer 340a lowers the cleanliness requirement to the processes for forming the elements under the etch stop material layer 170a, in accordance with some embodiments.

Figure 4:
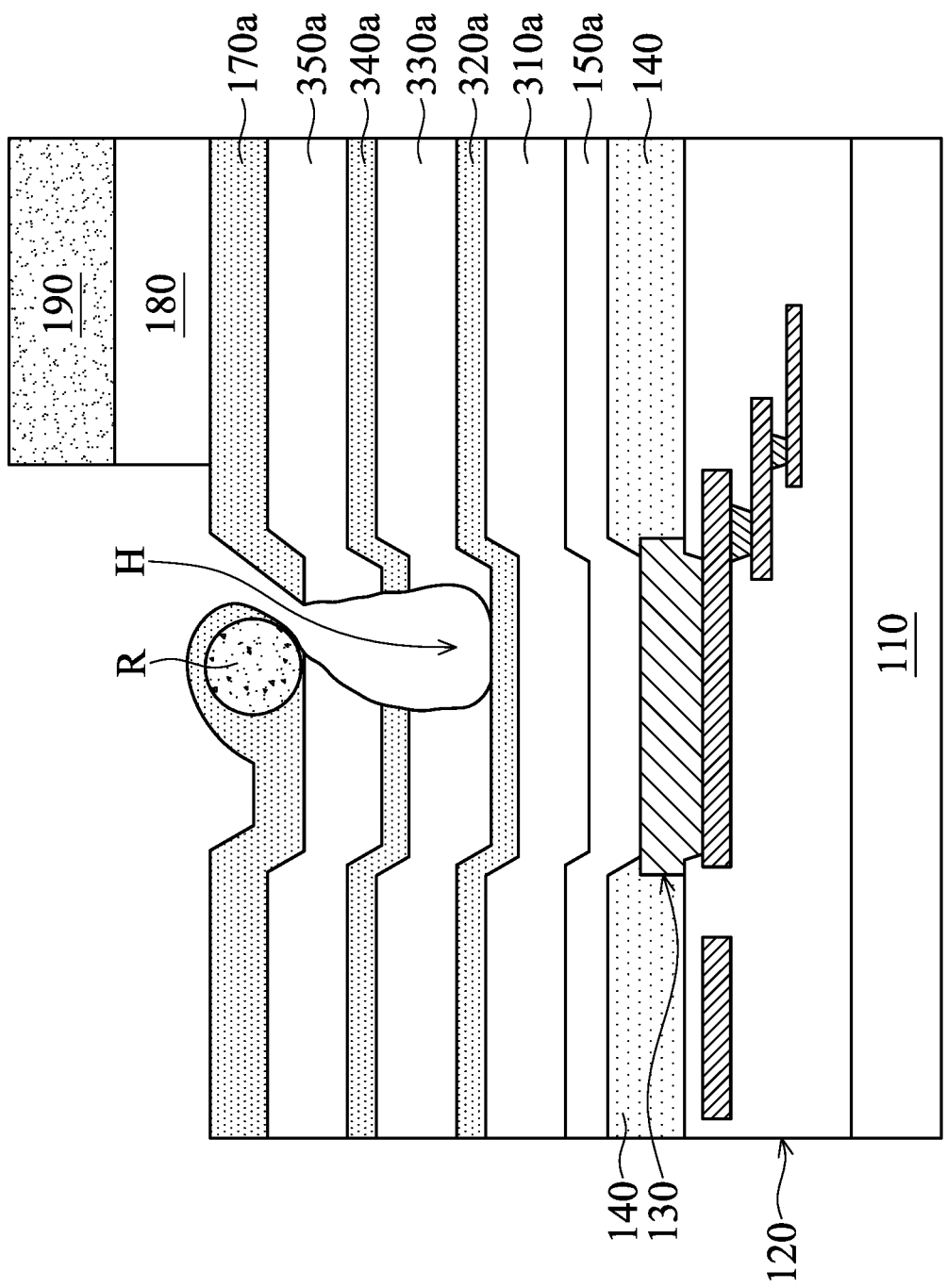
FIG. 4 is a cross-sectional view of a stage of a process for forming a chip structure, in accordance with some embodiments.

In some other embodiments, as shown in FIG. 4, the hole H further passes through the etch stop material layer 340a and the buffer material layer 330a. Since the etch stop material layer 320a is formed, the etching process stops at the etch stop material layer 320a, in accordance with some embodiments. Therefore, the formation of the etch stop material layer 320a prevents the conductive pad 130 from being etched and improves the yield of the removal process, in accordance with some embodiments. Furthermore, the formation of the etch stop material layer 320a lowers the cleanliness requirement to the processes for forming the elements under the etch stop material layer 170a, in accordance with some embodiments.

As shown in FIGS. 3B and 3C, the undesired particle R, the etch stop material layer 170a exposed by the mask layer 190 and the device element 180, the buffer material layer 350a thereunder, the etch stop material layer 340a thereunder, the buffer material layer 330a thereunder, the etch stop material layer 320a thereunder, the buffer material layer 310a thereunder, and the glue material layer 150a thereunder are removed, in accordance with some embodiments.

As shown in FIGS. 3B and 3C, the mask layer 190 is removed, in accordance with some embodiments. In this step, a chip structure 300 is substantially formed, in accordance with some embodiments.

In some embodiments, the mask layer 190 is removed during removing the undesired particle R, the etch stop material layer 170a exposed by the device element 180, the buffer material layer 350a thereunder, the etch stop material layer 340a thereunder, the buffer material layer 330a thereunder, the etch stop material layer 320a thereunder, the buffer material layer 310a thereunder, and the glue material layer 150a thereunder.

In some other embodiments, the mask layer 190 is removed after removing the undesired particle R, the etch stop material layer 170a exposed by the device element 180, the buffer material layer 350a thereunder, the etch stop material layer 340a thereunder, the buffer material layer 330a thereunder, the etch stop material layer 320a thereunder, the buffer material layer 310a thereunder, and the glue material layer 150a thereunder.

After the removal process, the remaining glue material layer 150a, the remaining buffer material layers 310a, 330a, and 350a, and the remaining etch stop material layer 320a, 340a, and 170a respectively form a glue layer 150, buffer layers 310, 330, and 350, and etch stop layers 320, 340, and 170, in accordance with some embodiments. The removal process includes an etching process, such as a dry etching process, in accordance with some embodiments.

Figure 5A:
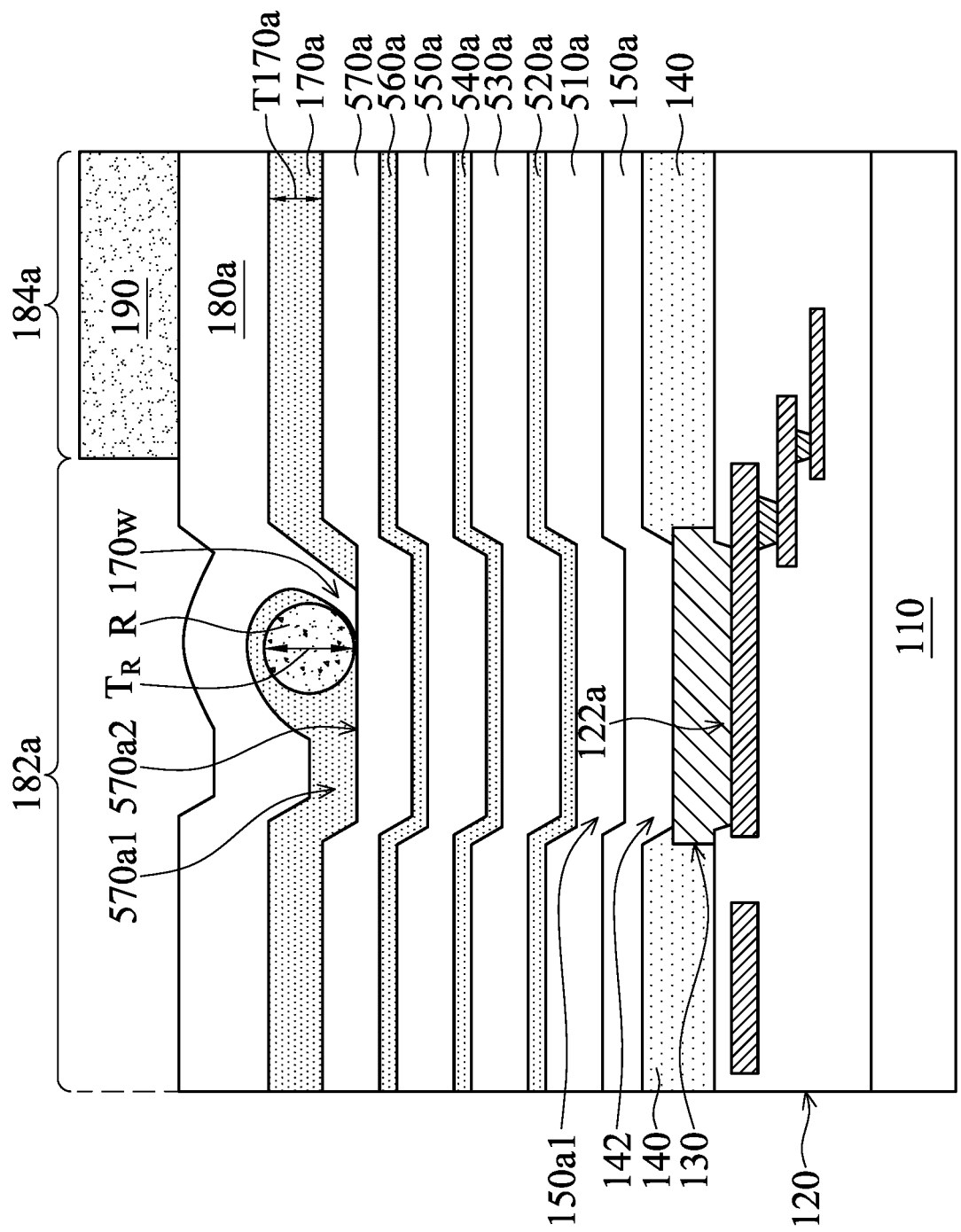
FIGS. 5A-5C are cross-sectional views of various stages of a process for forming a chip structure, in accordance with some embodiments.
Figure 5B:
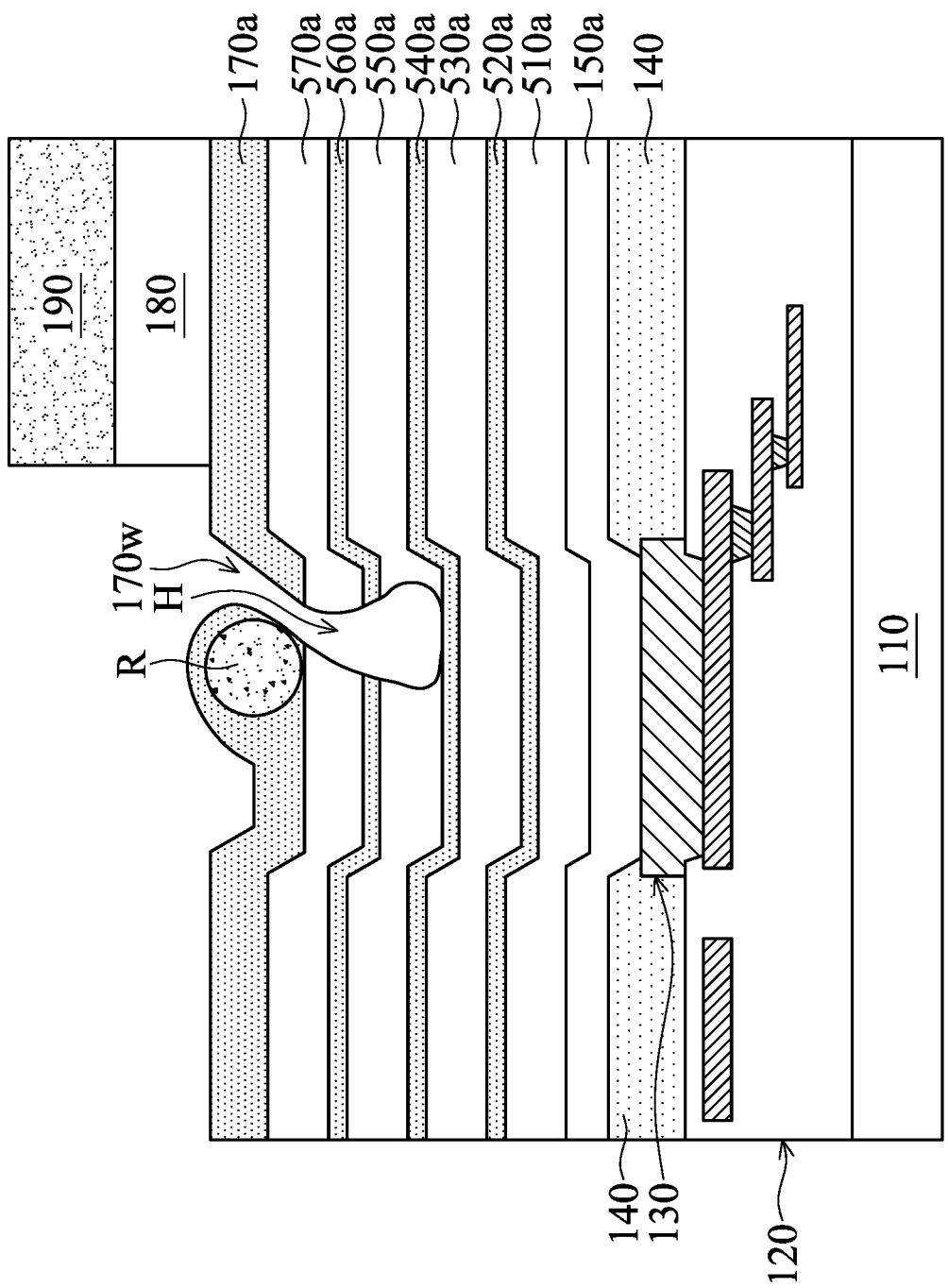
Figure 5C:
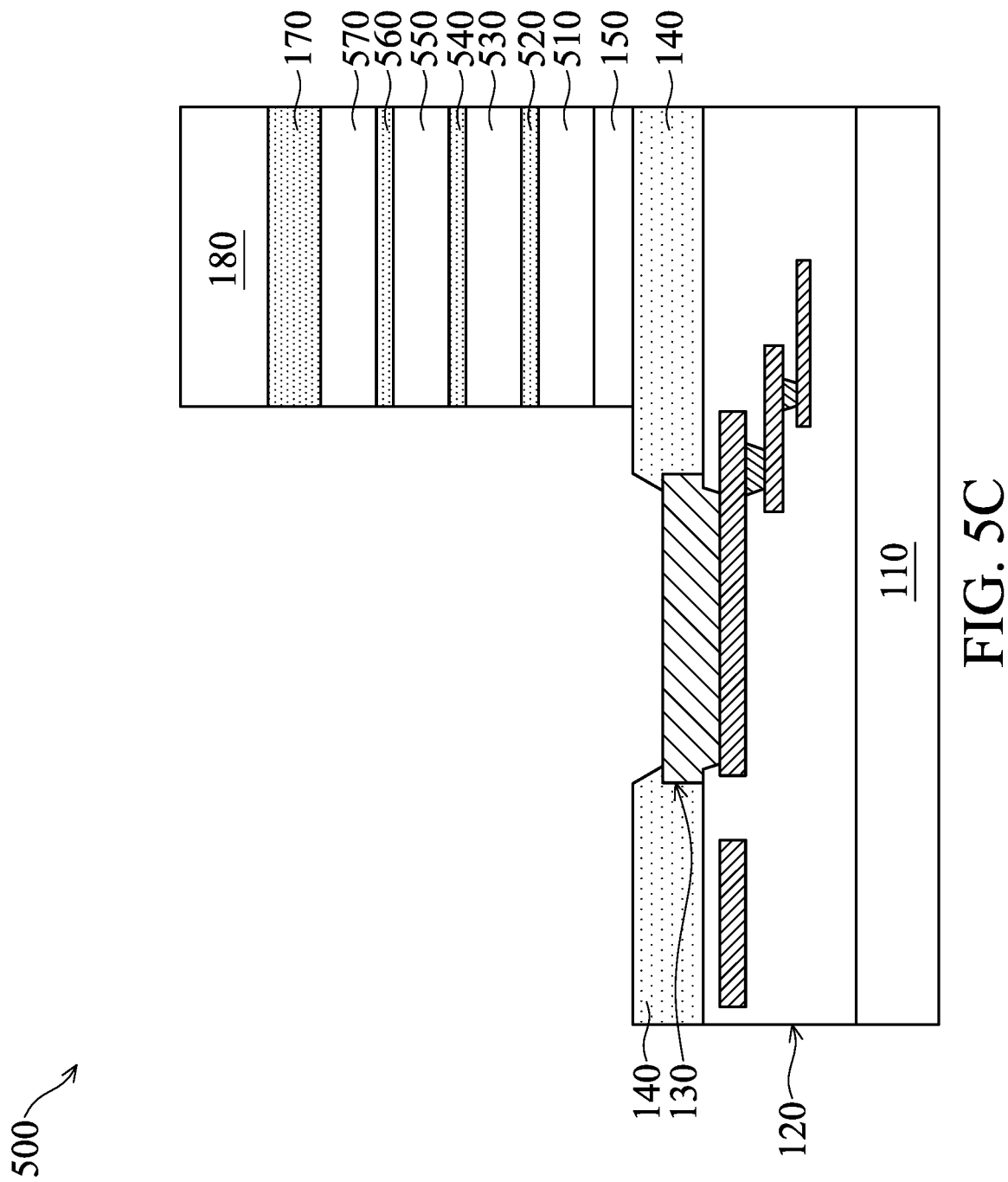

FIGS. 5A-5C are cross-sectional views of various stages of a process for forming a chip structure, in accordance with some embodiments. As shown in FIG. 5A, As shown in FIG. 5A, the step of FIG. 1A is performed to form the substrate 110, the interconnect structure 120, the conductive pads 130, the passivation layer 140, and the glue material layer 150a, in accordance with some embodiments.

As shown in FIG. 5A, a buffer material layer 510a, an etch stop material layer 520a, a buffer material layer 530a, an etch stop material layer 540a, a buffer material layer 550a, an etch stop material layer 560a, and a buffer material layer 570a are sequentially and conformally formed over the glue material layer 150a, in accordance with some embodiments.

The buffer material layer 510a, 530a, 550a, or 570a is thicker than the etch stop material layer 520a, 540a, or 560a, in accordance with some embodiments. The buffer material layer 510a, 530a, 550a, or 570a is thinner than the passivation layer 140, in accordance with some embodiments. The thicknesses of the buffer material layers 510a, 530a, 550a, and 570a and the etch stop material layers 520a, 540a, and 560a shown in FIG. 5A may be exaggerated for clarity and the convenience of labeling.

The buffer material layers 510a, 530a, 550a, and 570a are made of a silicon-containing material, such as silicon nitride or silicon oxide, in accordance with some embodiments. The buffer material layers 510a, 530a, 550a, and 570a are made of the same material, in accordance with some embodiments.

The buffer material layers 510a, 530a, 550a, and 570a are formed using a chemical vapor deposition process, such as a low-pressure chemical vapor deposition process, a plasma-enhanced chemical vapor deposition process, or a high-density plasma chemical vapor deposition process, an atomic layer deposition process, a spin-on process, a physical vapor deposition process, or another suitable process.

As shown in FIG. 5A, there is an undesired particle R in a recess 570a1 of the buffer material layer 570a, in accordance with some embodiments. As shown in FIG. 5A, an etch stop material layer 170a is formed over the buffer material layer 570a and the undesired particle R, in accordance with some embodiments.

The etch stop material layer 170a conformally covers the buffer material layer 570a and the undesired particle R, in accordance with some embodiments. In some embodiments, a sum of the thicknesses of the glue material layer 150a, the buffer material layers 510a, 530a, 550a, and 570a, and the etch stop material layer 170a, 520a, 540a, and 560a ranges from about 8000 Å to about 13000 Å.

A ratio of the thickness $T_R$ of the undesired particle R to the thickness T170a of the etch stop material layer 170a ranges from about 0.5 to about 6, in accordance with some embodiments. Since the height difference (e.g., the thickness $T_R$) between a top of the undesired particle R and a surface 570a2 of the buffer material layer 570a is very large, the etch stop material layer 170a is prone to have a weak portion 170w adjacent to the undesired particle R, in accordance with some embodiments. In some embodiments, as shown in FIG. 5A, the weak portion 170w is a hole, which passes through the etch stop material layer 170a.

The etch stop material layer 170a and the buffer material layer 570a are made of different materials, which improves an etching selectivity of the etch stop material layer 170a to the buffer material layer 570a, in accordance with some embodiments. The etch resistance of the material of the etch stop material layer 170a is greater than the etch resistance of the material of the buffer material layer 570a, in accordance with some embodiments. The etch stop material layer 170a is thicker than the etch stop material layer 520a, 540a, or 560a, in accordance with some embodiments.

The etch stop material layer 170a, 520a, 540a, or 560a is made of a metal-containing material, such as tantalum (Ta) and tantalum oxide (TaO), or a polymer material, such as polyimide, in accordance with some embodiments. In some embodiments, the etch stop material layers 170a, 520a, 540a, and 560a are made of the same material.

In some embodiments, the etch stop material layer 170a, 520a, 540a, or 560a is a multilayer structure having metal layers (e.g., Ta layers) alternatively stacked with metal oxide layers (e.g., TaO layers). The etch stop material layer 170a, 520a, 540a, or 560a is formed using a physical vapor deposition process, in accordance with some embodiments.

As shown in FIG. 5A, a device material layer 180a is formed over the etch stop material layer 170a, in accordance with some embodiments. The device material layer 180a has portions 182a and 184a, in accordance with some embodiments. The portion 182a covers the weak portion 170w of the etch stop material layer 170a and the undesired particle R, in accordance with some embodiments.

The portion 182a is over the conductive pad 130, in accordance with some embodiments. The device material layer 180a and the etch stop material layer 170a are made of different materials, in accordance with some embodiments. As shown in FIG. 5A, a mask layer 190 is formed over the portion 184a of the device material layer 180a, in accordance with some embodiments.

As shown in FIGS. 5A and 5B, the portion 182a of the device material layer 180a is removed, in accordance with some embodiments. The remaining device material layer 180a (i.e., the portion 184a) forms a device element 180, in accordance with some embodiments. The device element 180 is an inductor device, in accordance with some embodiments. The removal process includes a wet etching process, in accordance with some embodiments. The etch solution includes nitric acid and hydrofluoric acid, in accordance with some embodiments.

Since the etch resistance of the weak portion 170w of the etch stop material layer 170a is poor, the etch solution etches through or flows through the weak portion 170w, in accordance with some embodiments. Therefore, the etch solution etches away portions of the buffer material layer 570*a*, the etch stop material layer 560*a*, and the buffer material layer 550*a* under the weak portion 170*w*, which forms a hole H in the buffer material layer 570*a*, the etch stop material layer 560*a*, and the buffer material layer 550*a*, in accordance with some embodiments.

Since the etch stop material layer 540*a* is formed, the etching process stops at the etch stop material layer 540*a*, in accordance with some embodiments. Therefore, the formation of the etch stop material layer 540*a* prevents the conductive pad 130 from being etched and improves the yield of the removal process, in accordance with some embodiments. Furthermore, the formation of the etch stop material layer 540*a* lowers the cleanliness requirement to the processes for forming the elements under the etch stop material layer 170*a*, in accordance with some embodiments.

As shown in FIGS. 5B and 5C, the undesired particle R, the etch stop material layer 170*a* exposed by the mask layer 190 and the device element 180, the buffer material layer 570*a* thereunder, the etch stop material layer 560*a* thereunder, the buffer material layer 550*a* thereunder, the etch stop material layer 540*a* thereunder, the buffer material layer 530*a* thereunder, the etch stop material layer 520*a* thereunder, the buffer material layer 510*a* thereunder, and the glue material layer 150*a* thereunder are removed, in accordance with some embodiments.

In some embodiments, the mask layer 190 is removed during or after removing the undesired particle R, the etch stop material layer 170*a* exposed by the device element 180, the buffer material layers 510*a*, 530*a*, 550*a*, and 570*a* thereunder, the etch stop material layer 520*a*, 540*a*, 560*a*, and 170*a* thereunder, and the glue material layer 150*a* thereunder. In this step, a chip structure 500 is substantially formed, in accordance with some embodiments.

After the removal process, the remaining glue material layer 150*a*, the remaining buffer material layers 510*a*, 530*a*, 550*a*, and 570*a*, and the remaining etch stop material layer 520*a*, 540*a*, 560*a*, and 170*a* respectively form a glue layer 150, buffer layers 510, 530, 550, and 570, and etch stop layers 520, 540, 560, and 170, in accordance with some embodiments. The removal process includes an etching process, such as a dry etching process, in accordance with some embodiments.

Processes and materials for forming the chip structures 200, 300 and 500 may be similar to, or the same as, those for forming the chip structure 100 described above. Elements with the same or similar structures and/or materials as those in FIGS. 1A to 5C are labeled with the same reference numbers. Therefore, their detailed descriptions will not be repeated herein.

In accordance with some embodiments, chip structures and methods for forming the same are provided. The methods (for forming the chip structure) sequentially form a first etch stop layer, a buffer layer, and a second etch stop layer over a conductive pad to protect the conductive pad from being etched during subsequent etching processes. The first etch stop layer is used as a backup etch stop layer.

The methods sequentially form a thick buffer layer and an etch stop layer over a conductive pad to protect the conductive pad from being etched during subsequent etching processes. The thick buffer layer is used as a backup etch stop layer.

In accordance with some embodiments, a chip structure is provided. The chip structure includes a substrate. The chip structure includes an interconnect structure over the substrate. The chip structure includes a conductive pad over the interconnect structure. The chip structure includes a passivation layer covering the interconnect structure and exposing the conductive pad. The chip structure includes a first etch stop layer over the passivation layer. The chip structure includes a first buffer layer over the first etch stop layer. The first etch stop layer and the first buffer layer are made of different materials. The chip structure includes a second etch stop layer over the first buffer layer. The second etch stop layer and the first buffer layer are made of different materials. The chip structure includes a device element over the second etch stop layer.

In accordance with some embodiments, a chip structure is provided. The chip structure includes a substrate. The chip structure includes an interconnect structure over the substrate. The chip structure includes a conductive pad over the interconnect structure. The chip structure includes a passivation layer covering the interconnect structure and exposing the conductive pad. The chip structure includes a buffer layer over the passivation layer. The chip structure includes an etch stop layer over the buffer layer, wherein a ratio of a first thickness of the buffer layer to a second thickness of the etch stop layer ranges from about 10 to about 20. The chip structure includes a device element over the etch stop layer.

In accordance with some embodiments, a chip structure is provided. The chip structure includes a substrate. The chip structure includes an interconnect structure over the substrate. The chip structure includes a conductive pad over the interconnect structure. The chip structure includes a passivation layer covering the interconnect structure and exposing the conductive pad. The chip structure includes a first buffer layer over the passivation layer. The chip structure includes a first etch stop layer over the first buffer layer. The chip structure includes a second buffer layer over the first etch stop layer. The first buffer layer and the second buffer layer are made of a first material. The chip structure includes a second etch stop layer over the second buffer layer. The first etch stop layer and the second etch stop layer are made of a second material, and the second material is different from the first material. The chip structure includes a device element over the second etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
   a substrate;
   an interconnect structure over the substrate;
   a conductive pad over the interconnect structure;
   a passivation layer covering the interconnect structure and exposing the conductive pad;
   a first etch stop layer over the passivation layer;
   a first buffer layer over the first etch stop layer, wherein the first etch stop layer and the first buffer layer are made of different materials;
   a second etch stop layer over the first buffer layer, wherein the second etch stop layer and the first buffer layer are made of different materials; and a device element over the second etch stop layer.

2. The chip structure as claimed in claim 1, wherein the first etch stop layer and the second etch stop layer are made of a same material.

3. The chip structure as claimed in claim 1, wherein the first etch stop layer is a multilayer structure having metal layers alternatively stacked with metal oxide layers.

4. The chip structure as claimed in claim 1, wherein the second etch stop layer is thicker than the first etch stop layer.

5. The chip structure as claimed in claim 4, wherein the first buffer layer is thicker than the second etch stop layer.

6. The chip structure as claimed in claim 1, further comprising:
   a second buffer layer between the passivation layer and the first etch stop layer, wherein the second buffer layer and the first etch stop layer are made of different materials.

7. The chip structure as claimed in claim 6, wherein the second buffer layer is thicker than both the first etch stop layer and the second etch stop layer.

8. The chip structure as claimed in claim 6, further comprising:
   a third etch stop layer between the second buffer layer and the passivation layer, wherein the third etch stop layer and the second buffer layer are made of different materials.

9. The chip structure as claimed in claim 8, wherein the second buffer layer is thicker than the third etch stop layer.

10. The chip structure as claimed in claim 9, further comprising:
    a third buffer layer between the passivation layer and the third etch stop layer, wherein the third buffer layer and the third etch stop layer are made of different materials.

11. The chip structure as claimed in claim 6, further comprising:
    a glue layer conformally covering the passivation layer, wherein the glue layer is between the passivation layer and the second buffer layer, and the glue layer is thinner than both the passivation layer and the second buffer layer.

12. The chip structure as claimed in claim 11, wherein the glue layer is made of metal, and the glue layer is in direct contact with the passivation layer and the second buffer layer.

13. A chip structure, comprising:
    a substrate;
    an interconnect structure over the substrate;
    a conductive pad over the interconnect structure;
    a passivation layer covering the interconnect structure and exposing the conductive pad;
    a buffer layer over the passivation layer;
    an etch stop layer over the buffer layer, wherein a ratio of a first thickness of the buffer layer to a second thickness of the etch stop layer ranges from about 10 to about 20; and
    a device element over the etch stop layer.

14. The chip structure as claimed in claim 13, wherein an etch rate ratio of the buffer layer to the etch stop layer in a wet etching process ranges from about 10 to about 20.

15. The chip structure as claimed in claim 13, wherein the buffer layer is made of a silicon-containing material, and the etch stop layer is made of a metal-containing material.

16. The chip structure as claimed in claim 13, wherein the etch stop layer is a multilayer structure having metal layers alternatively stacked with metal oxide layers.

17. The chip structure as claimed in claim 13, wherein a first sidewall of the buffer layer and a second sidewall of the etch stop layer are substantially coplanar.

18. The chip structure as claimed in claim 13, wherein the passivation layer covers a peripheral portion of a top surface of the conductive pad.

19. A chip structure, comprising:
    a substrate;
    an interconnect structure over the substrate;
    a conductive pad over the interconnect structure;
    a passivation layer covering the interconnect structure and exposing the conductive pad;
    a first buffer layer over the passivation layer;
    a first etch stop layer over the first buffer layer;
    a second buffer layer over the first etch stop layer, wherein the first buffer layer and the second buffer layer are made of a first material;
    a second etch stop layer over the second buffer layer, wherein the first etch stop layer and the second etch stop layer are made of a second material, and the second material is different from the first material; and
    a device element over the second etch stop layer.

20. The chip structure as claimed in claim 19, wherein a first sidewall of the first buffer layer, a second sidewall of the first etch stop layer, a third sidewall of the second buffer layer, and a fourth sidewall of the second etch stop layer are substantially coplanar.

* * * * *